United States Patent
Mizushima et al.

(10) Patent No.: US 6,346,732 B1
(45) Date of Patent: Feb. 12, 2002

(54) SEMICONDUCTOR DEVICE WITH OXIDE MEDIATED EPITAXIAL LAYER

(75) Inventors: Ichiro Mizushima, Yokohama; Yuichiro Mitani, Zushi; Shigeru Kambayashi; Kiyotaka Miyano, both of Yokohama, all of (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/568,548

(22) Filed: May 11, 2000

(30) Foreign Application Priority Data

May 14, 1999 (JP) .......................................... 11-134401
Dec. 28, 1999 (JP) .......................................... 11-375404

(51) Int. Cl.$^7$ .......................... H01L 29/76; H01L 29/94
(52) U.S. Cl. ...................................... 257/382; 438/300
(58) Field of Search ............................... 257/368, 369, 257/382, 616; 438/197, 486, 300

(56) References Cited

U.S. PATENT DOCUMENTS

| | | | | |
|---|---|---|---|---|
| 4,975,387 A | * | 12/1990 | Prokes et al. ................ | 438/486 |
| 5,194,397 A | * | 3/1993 | Cook et al. ................... | 438/684 |
| 5,824,586 A | * | 10/1998 | Wollesen et al. ............ | 438/300 |
| 5,962,892 A | * | 10/1999 | Takeuchi ...................... | 257/327 |
| 6,091,117 A | * | 7/2000 | Shiozawa et al. ............ | 257/384 |

FOREIGN PATENT DOCUMENTS

| JP | 11-074507 | 3/1999 |
|---|---|---|
| JP | P3009979 | 12/1999 |

OTHER PUBLICATIONS

Chollet al., Si(100) epitaxy by low–temperature UHV–CVD: AFM study of the initial stages of growth, *J. Crystal Growth*, 157 (1995) 161–167.*

Tung, Ultrathin silicide formation for ULSI devices, *App. Surf. Sci.*, 117/118 (1997) 268–274.*

Kruger et al., Electrical properties of SiGe layers grown by LPE and CVD, *10$^{th}$ IEEE Proc. Semi. and insulating Mats.*, Jun. 1998, 185–189.*

Conard et al., XPS and TOFSIMS studies of shallow $Si/Si_{1-x}Ge_x/Si$ layers, Thin Solid Films, 343–344 (1999) 583–586.*

(List continued on next page.)

*Primary Examiner*—Amir Zarabian
*Assistant Examiner*—Christian D. Wilson
(74) *Attorney, Agent, or Firm*—Finnegan, Henderson, Farabow, Garrett & Dunner, L.L.P.

(57) ABSTRACT

A process is provided with which amorphous silicon or polysilicon is deposited on a semiconductor substrate. Then, a low-temperature solid phase growth method is employed to selectively form amorphous silicon or polysilicon into single crystal silicon on only an exposed portion of the semiconductor substrate. A step for manufacturing an epitaxial silicon substrate exhibiting a high manufacturing yield, a low cost and high quality can be employed in a process for manufacturing a semiconductor device incorporating a shrinked MOS transistor. Specifically, a silicon oxide layer having a thickness which is not larger than the mono-molecular layer is formed on the silicon substrate. Then, an amorphous silicon layer is deposited on the silicon oxide layer in a low-temperature region to perform annealing in the low-temperature region. Thus, the amorphous silicon layer is changed into a single crystal owing to solid phase growth. Thus, a silicon epitaxial single crystal layer exhibiting high quality is formed on the silicon substrate. The present invention is suitable as a process for manufacturing a high-speed and high degree of integration of a semiconductor device having an elevated source/drain structure and a SALICIDE structure.

5 Claims, 15 Drawing Sheets

OTHER PUBLICATIONS

Augendre et al., Elevated Source/Drain by Sacrificial Selective Epitaxy for High Performance Deep Submicron CMOS: Process Window versus Complexity, *IEEE Trans. Electron Devices*, 47 (2000) 1484.*

Tung et al., Epitaxial silicide interfaces in microelectronics, Thin Solid Films, 369 (2000) 233–239.*

Sakamoto et al., Growth of epitaxial $CoSi_2$ for contacts of ultra–thin SOI MOSFETs, Thin Solid Films, 369 (2000) 240–243.*

Miyano et al., Low Thermal Budget Elevated Source/Drain Technology Utilizing Novel Solid Phase Epitaxy and Selective Vapor Phase Etching, *IEEE IEDM*, Dec. 2000, 433–436.*

Mizushima et al., "Oxide–Mediated Solid Phase Epitaxy (OMSPE) of Silicon: A New Low–Temperature Epitaxy Technique Using Intentionally Grown Native Oxide", Japanese Journal of Applied Physics, vol. 39, No. 4B, Apr., 2000, pp. 2147–2150.

Mizushima, I. et al., "Oxide Mediated Solid Phase Epitaxy (OMSPE) of Silicon: A New Low Temperature Epitaxy Technique Using Intentionally Grown Native Oxide", Extended Abstracts of the 1999 International Conference on Solid State Devices and Materials, pp. 36–37, (1999).

Kotaki, H. et al., "Novel Elevated Silicide Source/Drain (ESSOD) by Load–Lock LPCVD–Si and Advanced Silicidation Processing Processing", IEEE, International Electron Device Meeting, pp. 839–842, (1993).

Nakano, M. et al., "Low Temperature and Facet–Free Epitaxial Silicon Growth by Contamination Restrained Load–Lock LPCVD System", Extended Abstracts of the 1994 International Conference on Solid State Devices and Materials, pp. 482–484, (1994).

* cited by examiner

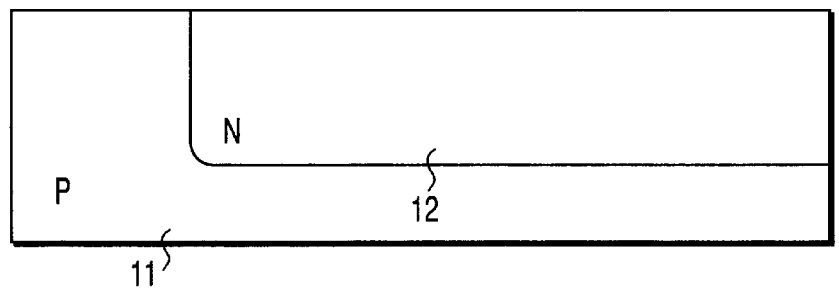
F I G. 13A
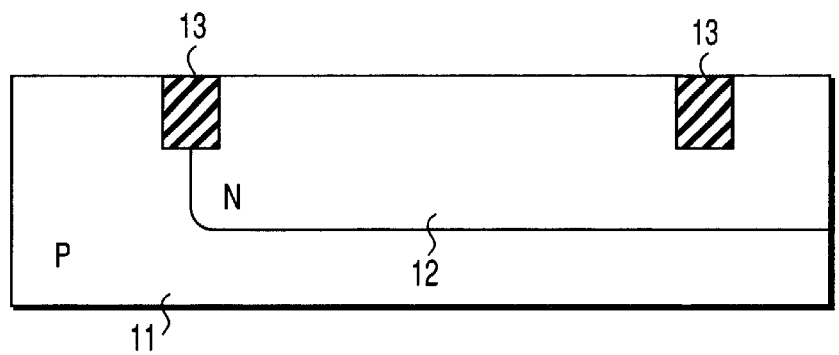
F I G. 13B
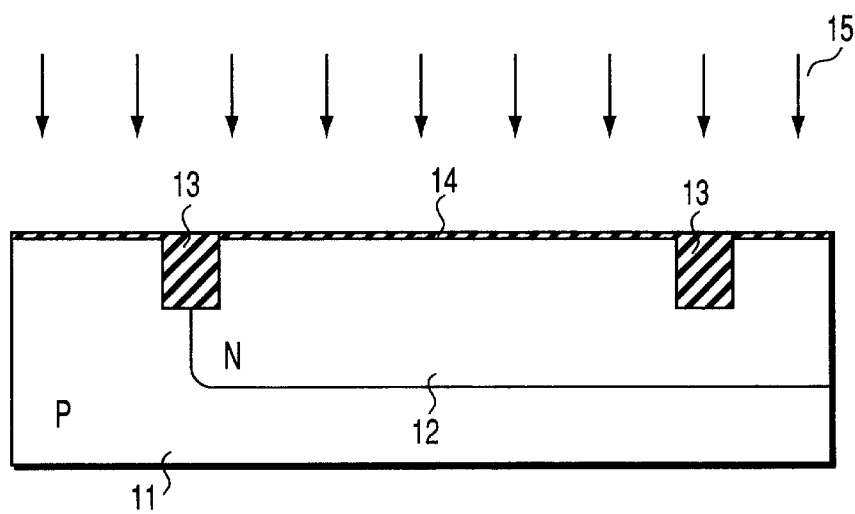
F I G. 13C
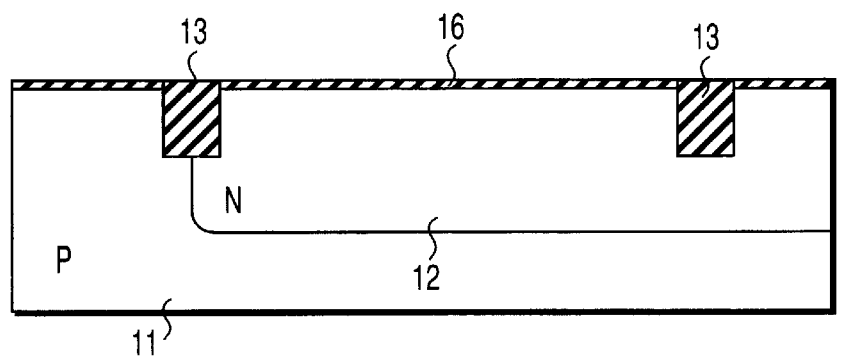
F I G. 13D

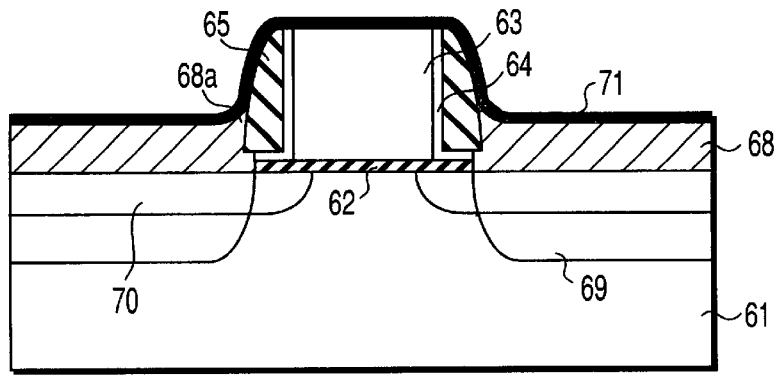
F I G. 16A
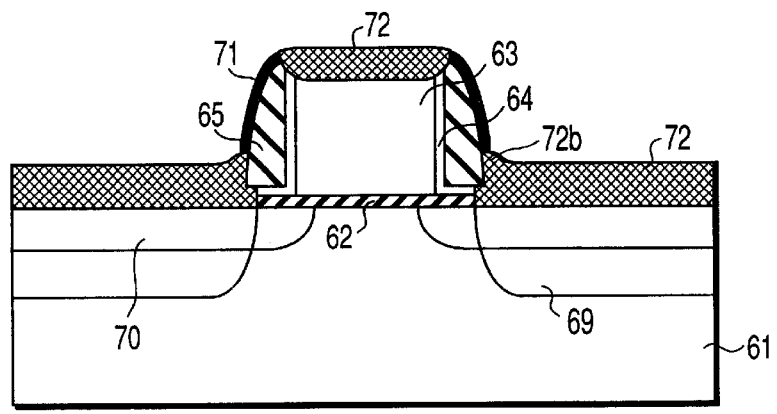
F I G. 16B
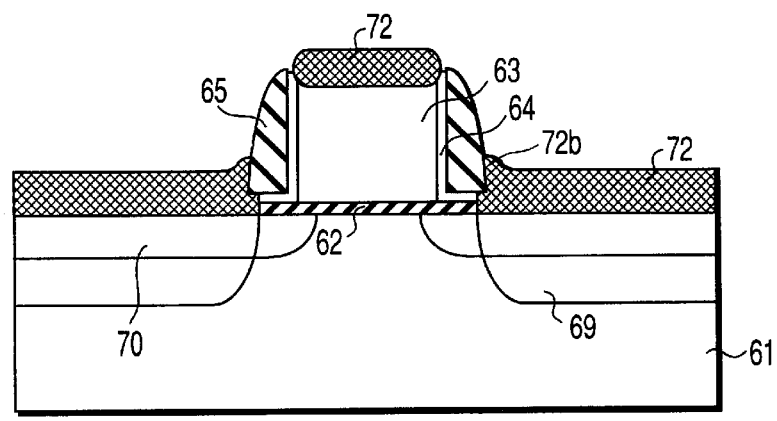
F I G. 16C
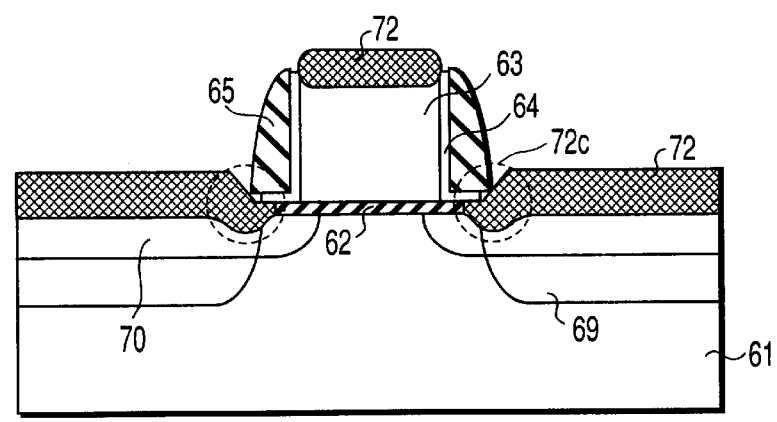
F I G. 16D

SEMICONDUCTOR DEVICE WITH OXIDE MEDIATED EPITAXIAL LAYER

CROSS-REFERENCE TO RELATED APPLICATIONS

This application is based upon and claims the benefit of priority from the prior Japanese Patent Applications No. 11-134401, filed May 14, 1999; and No. 11-375404, filed Dec. 28, 1999, the entire contents of which are incorporated herein by reference.

BACKGROUND OF THE INVENTION

The present invention relates to a semiconductor device incorporating a semiconductor epitaxial substrate and a method of manufacturing the same. More particular, the present invention relates to a semiconductor epitaxial substrate incorporating an epitaxial layer formed on a semiconductor substrate through mediation of a native oxide film and a method of manufacturing the same. More particular, the present invention relates to a method of manufacturing a semiconductor device incorporating a MOS transistor formed by using an elevated source/drain technology for forming an epitaxial layer on a source/drain impurity diffused region by using selective epitaxial growth formed through mediation of a native oxide film, and a semiconductor device incorporating a SALICIDE (Self-Aligned Silicide) MOS transistor formed by using the manufacturing method.

Since devices for constituting an LSI have been shrinked, problems have been increased which exert influences on the performance of the LSI. The problems are exemplified by a short-channel effect of a MOS transistor element and increase of the parasitic capacitance. To solve the problems, a SOI (Silicon on Insulator) structure has been investigated.

The SOI structure encounters a problem in that the crystallinity of a channel region cannot easily be maintained. Therefore, at least a wafer bonding technology or SIMOX (Separation by Implanted Oxygen) technology must be used. The foregoing technologies cause the cost increase of material and decrease of manufacturing yield to occur. The foregoing technologies encounter considerably increase of the cost as compared with the conventional technology which uses CZ (Czochralski) substrate.

To obtain high electron mobility in the channel region, an attempt has been made such that a SiGe mixed crystal layer is formed on a silicon substrate so as to be used as the channel region. In the foregoing case, a silicon substrate must be used as the substrate because substrates having high quality are easily available.

To obtain high electron mobility, it is preferable that the mixing ratio of Ge is raised. Since the lattice constant of Si and that of Ge are different from each other, a high-quality epitaxial substrate free from the defects cannot be obtained when the Ge mixing ratio is 20% or higher.

To expand the range of the possibilities of the LSI structure, an attempt has been made such that a silicon epitaxial growth step is inserted into a process for manufacturing the semiconductor device. For example, a semiconductor device is formed, and then the silicon epitaxial growth is performed on the device. Thus, formation of the device is again performed so that multi-layered semiconductor device formation is permitted. As a result, the device formation density can considerably be raised.

To achieve the foregoing technology, a defect free silicon epitaxial layer must be formed. Therefore, it has been considered very important to sufficiently remove a native oxide film on the silicon substrate which obstructs the growth process before the silicon epitaxial growth is performed.

If impurities, such as oxygen, are present on the substrate even in a small quantity, defects, such as dislocations, generate in the silicon epitaxial layer starting with surface oxide. To remove surface oxide, a deoxidizing heat treatment must be performed in a high temperature region near 1000° C. Therefore, the formation process of the high-quality silicon epitaxial layer cannot easily be employed in the device employed, silicidation occurs between metal and the silicon substrate. Thus, deposited metal reacts with the silicon substrate, causing silicidation proceeds while the surface layer of the silicon substrate is being eroded.

Therefore, formation of the shallow SID region in the silicon substrate and formation of a shallow junction free from large leakage current between the silicon substrate and the SID region have been very difficult.

To solve the above-mentioned problem, employment of a method has been considered with which silicon single crystal is epitaxially grown on the SID region formed on the silicon substrate. Then, the SID region of the MOS transistor is elevated to be higher than the surface of the silicon substrate, and then metal is deposited. Then, silicidation is allowed to proceed.

The foregoing method is able to simultaneously meet both of the requirement for forming a low-resistance SID region required to maintain the high-speed operation of the MOS transistor and the requirement for forming a shallow junction in the lower portion of the surface of the silicon substrate. The structure of the MOS transistor formed by epitaxially growing silicon on the SID region formed on the silicon substrate is called an elevated SID structure.

Usually, the elevated SID structure is formed by manufacturing process, the processing temperature of which has an upper limit.

Since the operation speed of the MOS transistor has been raised and the structure of the same has been shrinked, a shallow source/drain impurity diffusion region (hereinafter called a SID region) of the MOS transistor has been required which has low resistance.

A high-performance transistor must have shallow junctions in the SID region. When a silicon layer is epitaxially grown on the SID region and implanting impurity ions upon the silicon epitaxial layer, shallow junctions can be formed from the surface of the silicon substrate. As described above, employment of the silicon epitaxial growth in the process for manufacturing the MOS LSI has become important in recent years.

In the conventional MOS LSI industrial field, there is a technology called a self-aligned silicide or SALICIDE for realizing a shrinked device which is capable of performing a high-speed operation. That is, metal, such as Co or Ti, is deposited in an impurity diffused region in a self-aligned manner to form silicide.

On the other hand, progress of the technology for shrinking semiconductor device raises a necessity for shallow SID diffused region in order to prevent the short channel effect. When the SALICIDE technology is performing heat treatment at 800° C. or higher by operating a LPCVD (Low Pressure Chemical Vapor Deposition) reactor. Therefore, the impurity profiles in the S/D region and the channel region, which has been formed by ion implantation, are changed. Thus, the designed performance cannot be exhibited.

Since B (boron) in the gate electrode is diffused into the channel region, the gate electrode is depleted, a critical problem arises in that the threshold voltage is changed.

To perform selective epitaxial growth, an UHVCVD (Ultra High Vacuum Chemical Vapor Deposition) reactor or the LPCVD reactor is usually used. In particular, it is preferable that the LPCVD reactor is used because the LPCVD reactor has frequently been employed in the ULSI manufacturing process and has an excellent track record from viewpoints of improving the manufacturing efficiency and the stability of the process.

A representative selective epitaxial growth using the LPCVD method is performed by a vapor phase epitaxial growth in a mixed atmosphere of a silicon source material, such as silane or dichlorosilane and etching gas of chlorine or hydrochloric acid.

Since thermal diffusion of dopants is tightly limited in the future shrinked semiconductor device, it is preferable that the thermal process of the CVD is performed at lower temperatures.

To obtain a practically satisfactory deposited film thickness by the vapor phase growth method using the LPCVD, high temperature heat treatment at 800° C. or higher is required. In the next generation device that has the gate length of 0.1 µm or shorter, change in the channel profile and diffusion of impurities from the gate to the channel cannot be ignored.

As described above, employment of the SOI (Silicon on Insulator) structure has been expected to be adaptable to the shrinking of the devices constituting the MOS LSI. An SOI structure having excellent crystallinity in the channel region cannot easily be realized. Therefore, at least the wafer bonding technology and the SIMOX technology must be employed. The foregoing technologies, however, encounter increase in the number of manufacturing steps, the cost increase of the material and lowering in the manufacturing yield. As compared with the conventional technology using the CZ substrate, the cost cannot be reduced.

To obtain high electron mobility in the channel region, an attempt has been made that a SiGe Layer is formed on the silicon substrate. There arises a problem in that a high-quality epitaxial layer exhibiting a low defect density cannot be obtained when the Ge mixed crystal ratio is 20% or higher due to the large difference between the lattice constant of Si and that of Ge.

When a silicon epitaxial step is employed in the process for manufacturing a semiconductor device to expand the range of the possibilities of the LSI structure, a high-temperature heat treatment at about 1000° C. is required to obtain a silicon epitaxial layer exhibiting excellent crystallinity. Thus, there arises a problem in that the high-temperature heat treatment should be included in the device manufacturing process, the process temperature of which is highly limited.

To form a shallow S/D junction suitable for a shrinked MOS transistor by the SALICIDE technology, employment of an elevated S/D structure raises a necessity for performing a high-temperature step at 800° C. or higher by using an LPCVD reactor. The channel region formed previously and the impurity profile in the S/D region are undesirably changed. Thus, there arises a problem in that a designed performance of the MOS transistor cannot be obtained.

BRIEF SUMMARY OF THE INVENTION

To solve the above-mentioned problems, a first object of the present invention is to provide a high-quality epitaxial silicon substrate formed by using a method of changing an amorphous silicon layer deposited in a low-temperature region into single crystal by a solid phase epitaxial growth method, a semiconductor substrate incorporating a SOI structure such as SIMOX by applying the epitaxial silicon substrate, and a high-quality silicon epitaxial substrate in which the mixed crystal ratio of Ge is higher than 20% and capable of reducing crystal defects and a manufacturing method therefor.

A second object of the present invention is to raise the density and the performance of a semiconductor device by forming a MOS transistor having an elevated S/D structure and a SALICIDE structure by employing a growth step of an epitaxial silicon single crystal layer in a process for manufacturing a semiconductor device such that the increase in the number of manufacturing steps, the cost of the material and lowering in the manufacturing yield are prevented.

The present invention relates to a semiconductor device incorporating a semiconductor epitaxial substrate and a manufacturing method therefor. More particularly, an object of the present invention is to provide a semiconductor epitaxial substrate incorporating a high-quality epitaxial single crystal layer formed by depositing an amorphous silicon layer or a polysilicon layer on a semiconductor substrate through mediation of a native oxide film thinner than a mono-molecular layer by vapor phase growth and by forming the layers into a single crystal layer by a solid phase epitaxial growth method (hereinafter called SPE) in a low-temperature region and a manufacturing method therefor.

In the present invention, an amorphous silicon layer or a polysilicon layer is deposited on the overall surface of a silicon substrate including a S/D region of a MOS transistor formed on the silicon substrate. Then, an SPE method is employed to selectively grow single crystal on only the S/D region without any high-temperature process.

The SPE method is able to epitaxially grow single crystal on a silicon substrate by performing only a heat treatment step in a low-temperature region. Therefore, the residual amorphous or polysilicon layer on the surface of the silicon substrate except for the S/D region is removed by etching. Thus, a semiconductor device having an elevated S/D structure can be provided without a necessity for performing a complicated step.

Specifically, a method of manufacturing an epitaxial semiconductor substrate according to the present invention comprises the steps of: forming a thin oxide layer on a semiconductor substrate; depositing either of an amorphous silicon layer or a polysilicon layer on the semiconductor substrate through mediation of the thin oxide layer; and forming an epitaxial semiconductor layer by crystallizing the amorphous silicon layer or the polysilicon layer, wherein the thickness of the thin oxide layer is in a range from $2 \times 10^{14}$ cm$^{-2}$ to $8 \times 10^{14}$ cm$^{-2}$ which is a value of a concentration of interface oxide between the semiconductor substrate and the epitaxial semiconductor layer.

A method of manufacturing a semiconductor device according to the present invention comprises the steps of: forming an insulating film embedded in an isolation trench; forming a gate insulating film on a semiconductor substrate; forming a gate electrode covered with an insulating film on the gate insulating film; forming an exposed portion of the surface of the semiconductor substrate by removing the gate insulating film except for at least a lower portion of the gate electrode; forming a thin oxide layer on the surface of the exposed portion of the semiconductor substrate such that the value of the concentration of surface oxide is in a range from $3 \times 10^{11}$ cm$^{-2}$ to $1.1 \times 10^{15}$ cm$^{-2}$;

depositing an amorphous silicon layer or a polysilicon layer to cover the thin oxide layer which is in contact with the exposed portion of the semiconductor substrate and the gate electrode covered with the insulating film; forming only either the amorphous silicon layer or the polysilicon layer which is in contact with the exposed portion of the semiconductor substrate through mediation of the thin oxide layer into single crystal by selectively solid phase growing either of the amorphous silicon layer or the polysilicon layer; and performing etching to remove either of the amorphous silicon layer or the polycrystalline silicon layer left on the insulating film which covers the gate electrode and the insulating film embedded in the isolation trench.

An epitaxial substrate according to the present invention comprises: a thin oxide layer formed on a semiconductor substrate; and an epitaxial semiconductor layer formed through mediation of the thin oxide layer, wherein a thickness of the thin oxide layer is in a range from $2\times10^{14}$ cm$^{-2}$ to $8\times10^{14}$ cm$^{-2}$ which is a value of a concentration of interface oxide between the semiconductor substrate and the epitaxial semiconductor layer.

A semiconductor device according to the present invention comprises: a gate insulating film formed on a semiconductor substrate; a gate electrode covered with an insulating film and formed on the gate insulating film; an exposed surface of the semiconductor substrate formed in a source region and a drain region; a thin oxide layer which is in contact with the exposed surface of the semiconductor substrate; a single crystal layer formed to be in contact with the exposed surface of the semiconductor substrate through mediation of the thin oxide layer such that a thickness of the single crystal layer at an end of the insulating film for covering the gate electrode is the same or larger than the thickness of an other portion of the single crystal layer; a metal silicide layer formed at least on the single crystal layer.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 13A to 13K are cross sectional views showing steps of a method of manufacturing a semiconductor device according to an eighth embodiment;

FIGS. 16A to 16D are cross sectional views showing a method of manufacturing a MOS transistor having a SALICIDE structure according to an eleventh embodiment.

DETAILED DESCRIPTION OF THE INVENTION

Figure 1A:
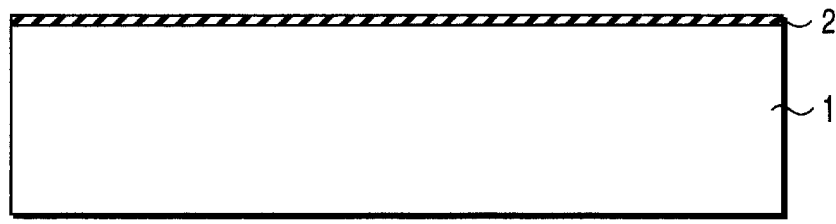
FIGS. 1A and 1B are cross sectional views showing a step for forming an epitaxial layer according to a first embodiment.
Figure 1B:
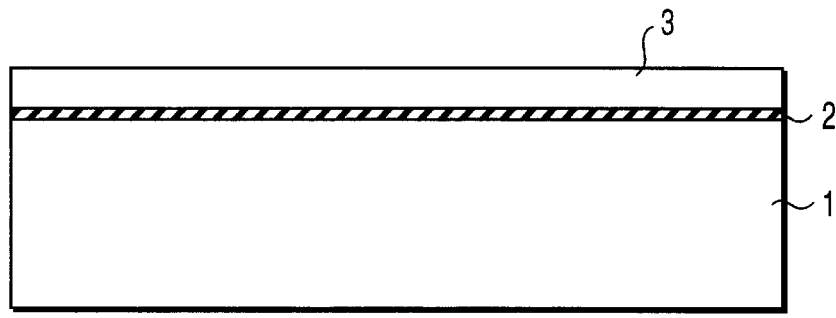
Figure 2:
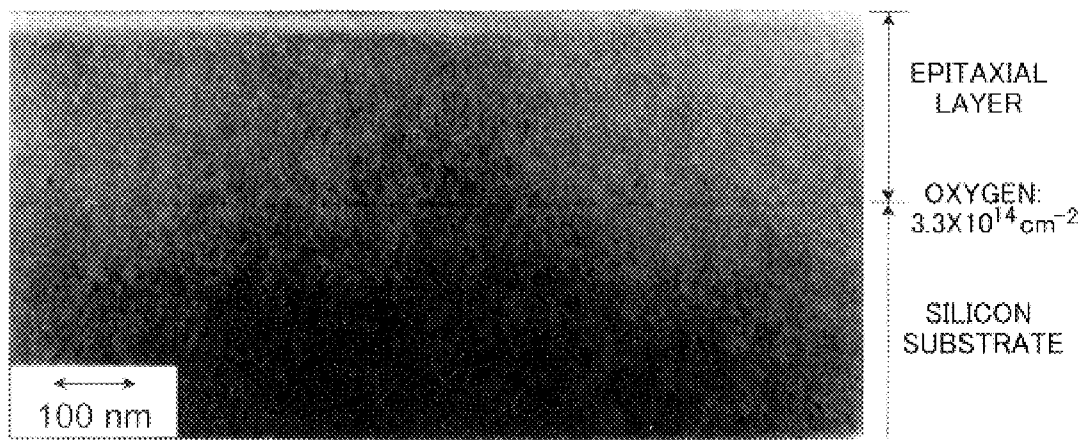
FIG. 2 is a TEM micrograph showing the cross section of a satisfactory epitaxial layer according to the first embodiment.

Referring to FIGS. 1A, 1B and FIG. 2, a method of manufacturing a semiconductor substrate according to a first embodiment will now be described. FIGS. 1A and 1B are cross sectional views showing steps for manufacturing the semiconductor substrate according to the first embodiment of the invention. In the first embodiment, a case will be described in which silicon single crystal is employed as the material of the semiconductor substrate.

Initially, a silicon substrate 1 is subjected to pretreatment using diluted hydrofluoric acid solution to remove a native oxide formed on the surface of the silicon substrate 1. Then, the silicon substrate 1 is, for three hours, exposed to the atmosphere, the humidity and temperature of which is 30% and 25° C., respectively. As a result of the foregoing exposure, a very thin oxide layer 2 is formed on the silicon substrate 1.

Then, as shown in FIG. 1B, the silicon substrate 1 is loaded into a LPCVD furnace. Thus, SiH$_4$ source gas is used to deposit an amorphous silicon layer 3 under conditions that the deposition temperature is 550° C. and the pressure is 0.3 Torr.

Then, the silicon substrate 1 is taken out of the LPCVD furnace, and then heat treatment is, for three hours, performed at 700° C. in an ambient of employed, a high-quality silicon epitaxial crystal can easily be grown in the low temperature region as compared with the conventional CVD method.

As shown in FIGS. 3 to 7, a second embodiment will now be described. In the second embodiment, the thickness of the native oxide film at the interface between the substrate and the epitaxial growth layer is sequentially changed. A vapor phase growth method is employed to deposit an amorphous silicon layer. Then, a SPE method is employed to change the amorphous silicon layer into a single crystal. A range of the thickness of the native oxide film to optimize the foregoing step will now be described. Moreover, the reason why the optimum range for the thickness of the native oxide will specifically be described.

Figure 3:
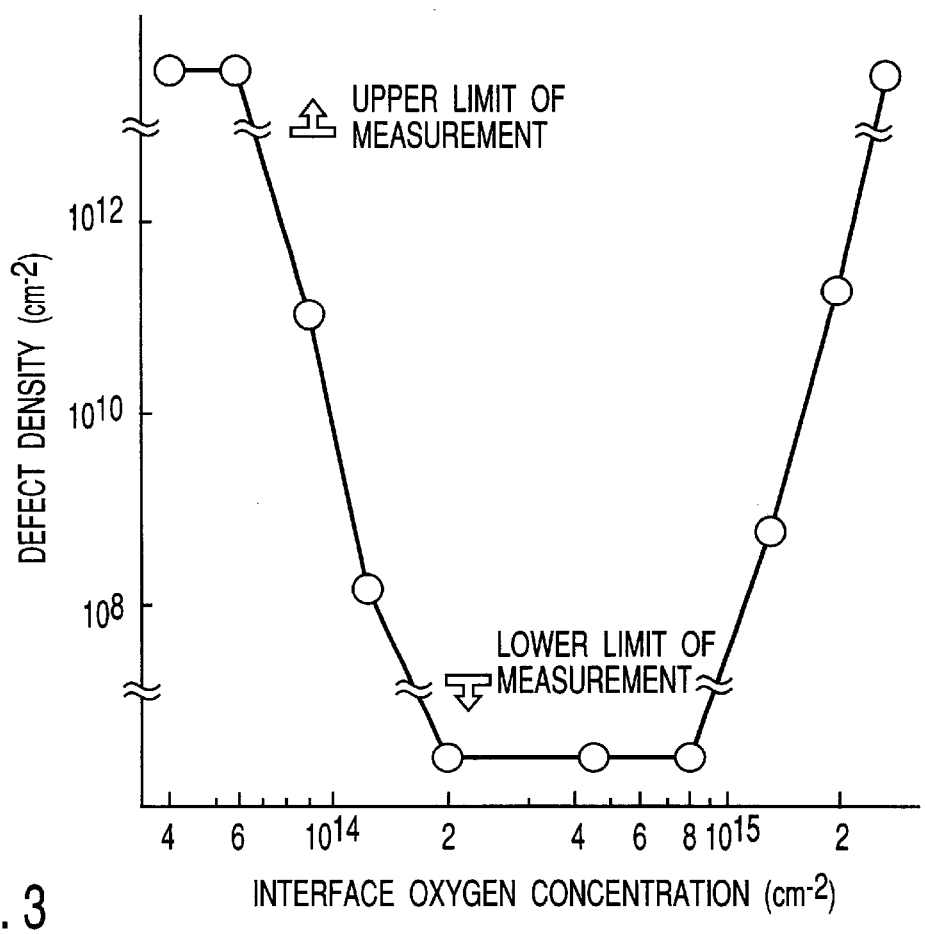
FIG. 3 is a graph showing the relationship between concentrations of interface oxygen and defect densities according to a second embodiment.

FIG. 3 shows the correspondence between the oxygen amount at the interface between the silicon substrate and the epitaxial growth layer and the crystallinity of the epitaxial silicon single crystal layer formed by the method according to the present invention. The oxygen amount at the interface was obtained by measuring the depth profile of the oxygen concentration by using a SIMS (Secondary Ion Mass Spectroscopy) and by calculating the integral of the interface oxygen concentration.

An example of the SIMS profile of oxygen when the interface oxygen concentration is $1.5 \times 10^{14}$ cm$^{-2}$ is atmospheric pressure nitrogen to form the amorphous silicon layer 3 into single crystal by an SPE method. Thus, the amorphous silicon layer 3 can be changed to a single crystal layer formed on the silicon substrate 1.

The crystallinity of the thus-formed epitaxial silicon single crystal layer was observed with a cross sectional TEM (Transmission Electron Microscope). As a result, a single crystal free from any defect as shown in FIG. 2 was confirmed. A value of $3.3 \times 10^{14}$ cm$^{-2}$ which is the interface oxygen concentration between the silicon substrate and the epitaxial layer corresponds to the film thickness of the oxide layer 2 shown in FIGS. 1A and 1B as described later.

If a native oxide film is, in the epitaxial growth method, formed in the interface between the substrate and the epitaxial growth layer, it has usually been the case that defects are generated in the deposited epitaxial growth layer without exception.

Figure 4:
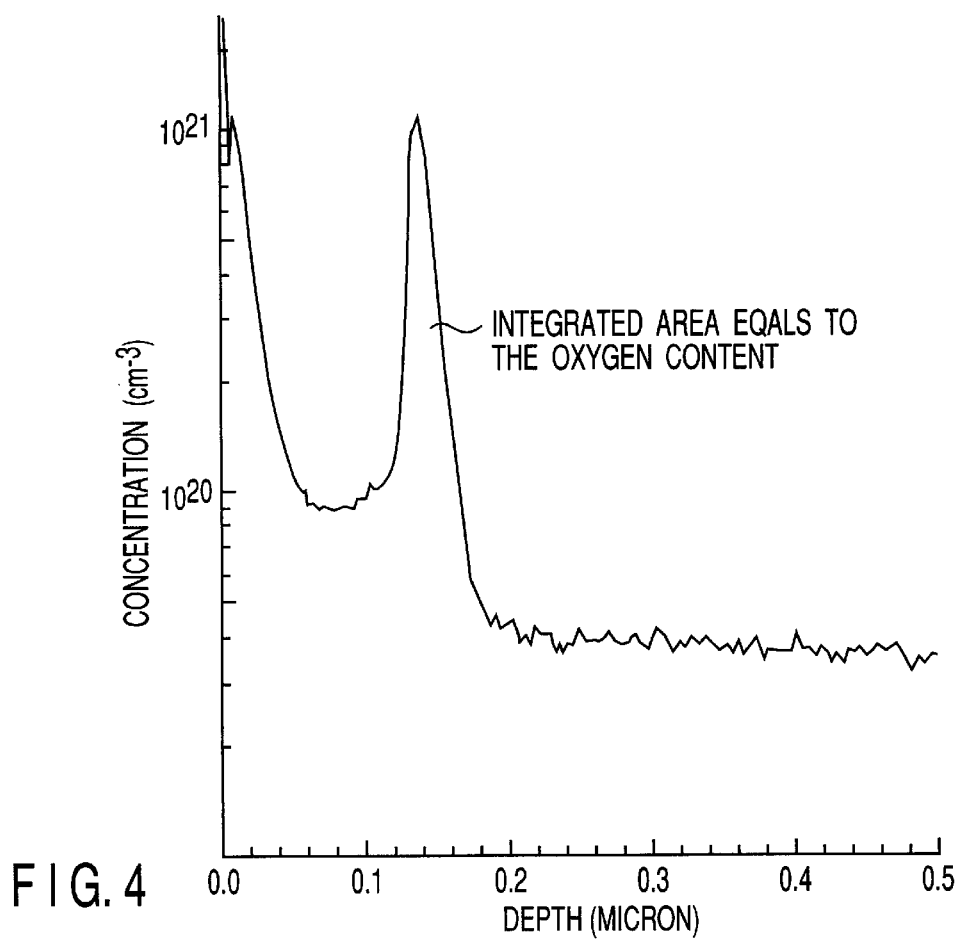
FIG. 4 is a graph showing a SIMS profile of oxygen.

However, the inventors of the present invention have found a fact that employment of the method with which the amorphous silicon layer 3 deposited at 550° C. by using the vapor phase growth method is transformed into single crystal by the SPE method which is executed in a low temperature region of 700° C. enables generation of defects in the epitaxial silicon single crystal layer to be prevented. When the foregoing method is shown in FIG. 4. The interface oxygen concentration can be controlled by changing exposure time after the pretreatment in the diluted hydrofluoric acid solution described in the first embodiment.

Figure 5:
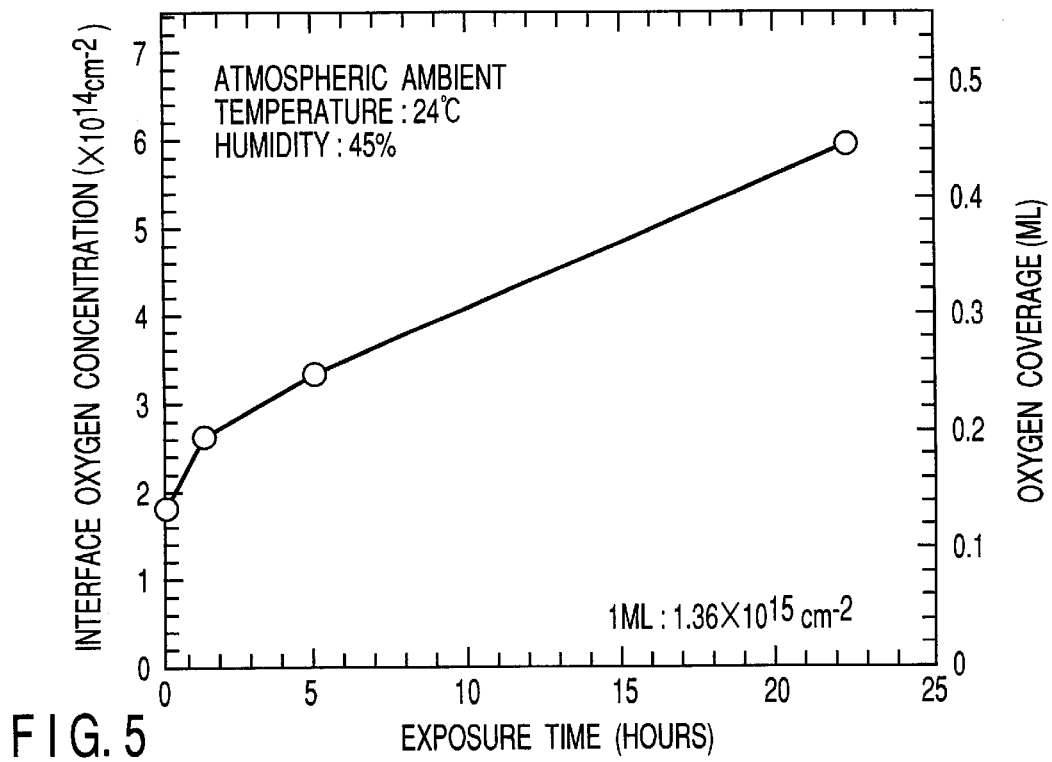
FIG. 5 is a graph showing the relationship between exposure time and interface oxygen concentration realized after a diluted hydrofluoric acid process.

FIG. 5 shows the relationship between the exposure time and the interface oxygen concentration. Note that the left-hand axis of ordinate stands for the interface oxygen concentration. The right-hand axis of ordinate stands for the coverage of the interface plane with oxygen in units of the mono-molecular layer (ML). The conversion into the coverage was performed by dividing the interface oxygen concentration with the value of a surface atomic density which was $1.36 \times 10^{15}$ cm$^{-2}$.

Note that the exposure to the atmospheric ambient was performed under controlled conditions that the temperature was 24° C. and the humidity was 45%. As can be understood from FIG. 5, a fact was confirmed that change of the exposure time causes the interface oxygen concentration to be changed to cover a range from $1.5 \times 10^{14}$ cm$^{-2}$ to $6 \times 10^{14}$ cm$^{-2}$.

The value of the interface oxygen concentration can be controlled by changing rinsing time in pure water after the foregoing pretreatment which is performed in diluted hydrofluoric acid solution as well as changing the exposure time in the atmospheric ambient. The control may be carried out by performing heat treatment in a gas atmosphere containing heated oxidizing gas immediately before the amorphous silicon layer is deposited by the VPE (CVD) method when the silicon substrate is loaded into the LPCVD furnace.

Note that deposition of the amorphous silicon layer is not limited to the LPCVD method. For example, CVD (UHVCVD) in an ultrahigh vacuum or vacuum evaporation may be employed.

As described above, the thickness of the native oxide film at the interface between the silicon substrate and the epitaxial growth layer was sequentially changed. The vapor phase growth method was used to deposit the amorphous silicon layer. Then, the SPE method was employed to change the amorphous silicon layer into single crystal. The foregoing step was performed so that the relationship between the defect density in the epitaxial silicon single crystal layer and the interface oxygen concentration was obtained. Thus, results shown in FIG. 3 were obtained.

As can be understood from FIG. 3, the interface oxygen concentration satisfies the range from $2 \times 10^{14}$ cm$^{-2}$ to $8 \times 10^{14}$ cm$^{-2}$ under the conditions that the deposition temperature of the amorphous silicon layer was 550° C. and the growth temperature of the epitaxial silicon single crystal layer was 700° C. in the SPE method. When the foregoing range is satisfied, the silicon epitaxial single crystal layer exhibiting excellent crystallinity with the defect density lower than the limit of measurement was obtained. If the foregoing range was not satisfied, the defect density in the silicon epitaxial single crystal layer was raised.

Therefore, there is estimation that the optimum interface oxygen concentration for obtaining a satisfactory silicon epitaxial single crystal layer is about 0.25 ML which is the converted thickness of the SiO$_2$ film to which the interface oxygen concentration has been converted. The foregoing interface oxygen concentration is the optimum value for growing the silicon epitaxial single crystal layer from the amorphous silicon layer by the SPE method at least on the plane (100) of silicon, the amorphous silicon layer being deposited by the vapor phase growth method.

Figure 6:
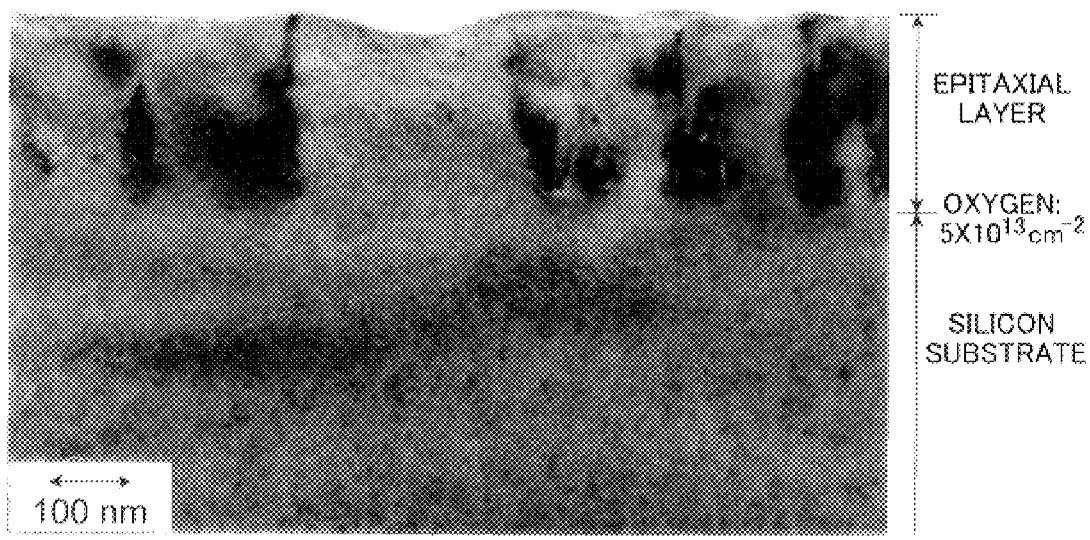
FIG. 6 is a TEM micrograph showing the cross section of an epitaxial layer in which the interface oxygen concentration is a low value of $5\times10^{13}$ cm$^{-2}$ and which have encountered defects after heat treatment has been performed.

FIG. 6 shows a TEM micrograph showing the cross section of a silicon epitaxial single crystal layer formed by depositing amorphous silicon layer at 550° C. in which the interface oxygen concentration was about $5 \times 10^{13}$ cm$^{-2}$ which was lower than the foregoing value. Then, the amorphous silicon layer was subjected to heat treatment at 700° C. A fact can be understood that dislocations occur in the direction of the growth (in the direction of the film thickness). Moreover, the film thickness was large in the region in which the dislocation occurred.

Figure 7:
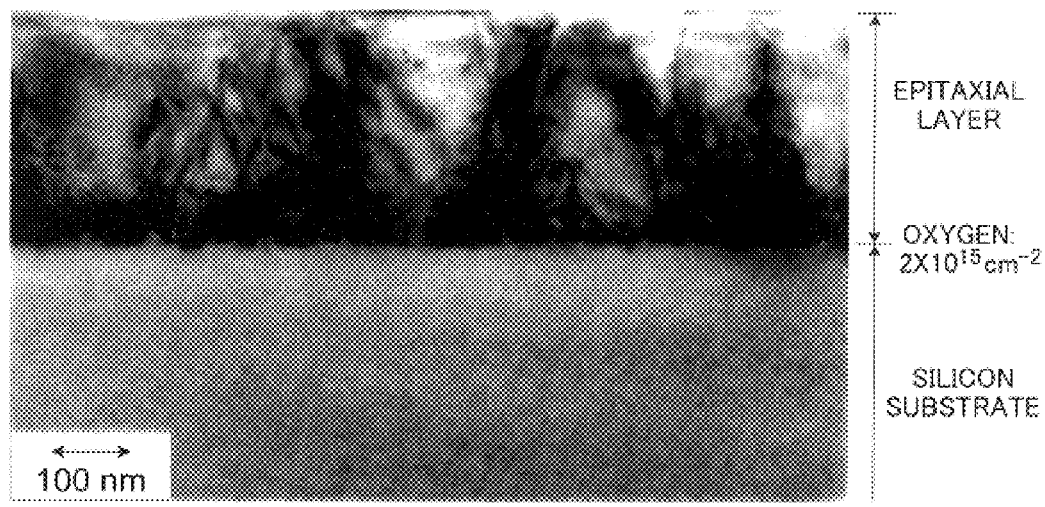
FIG. 7 is a TEM micrograph showing the cross section of an epitaxial layer in which the interface oxygen concentration is a high value of $2\times10^{15}$ cm$^{-2}$ and which have encountered a twin boundary after the heat treatment has been performed.

FIG. 7 shows a TEM micrograph showing the cross section of a silicon epitaxial single crystal layer formed by depositing amorphous silicon layer at 550° C. in which the interface oxygen concentration was a high level of about $2 \times 10^{15}$ cm$^{-2}$. Then, the amorphous silicon layer was subjected to heat treatment at 700° C. The surface was flat. A fact can be understood that twin boundaries are present at high density even though the single crystalline nature of the base silicon substrate is transferred to the epitaxial layer.

Figure 8:
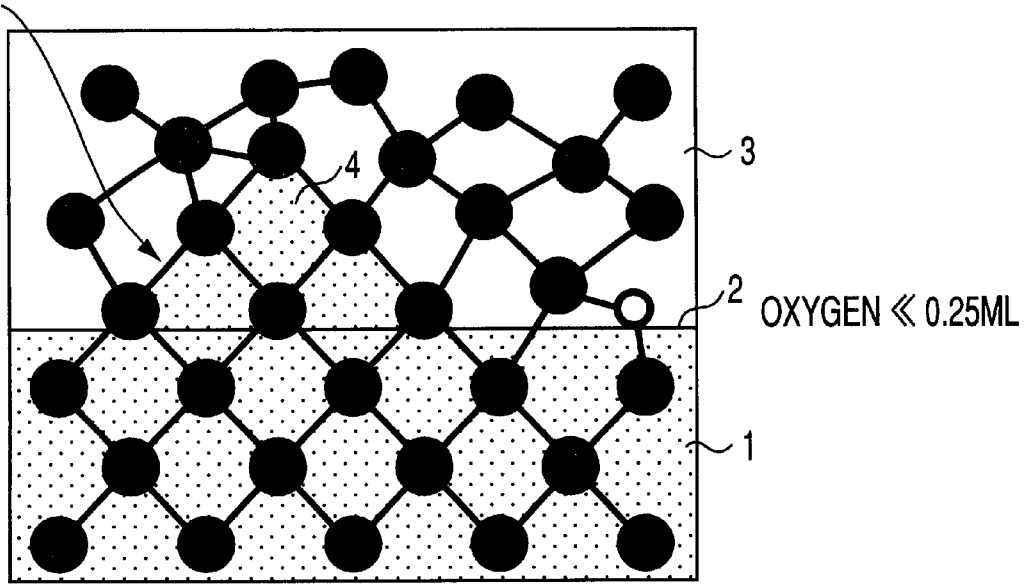
FIG. 8 is diagram showing a crystal model indicating generation of partially crystallized region in a case where the interface oxygen concentration is low.
Figure 9:
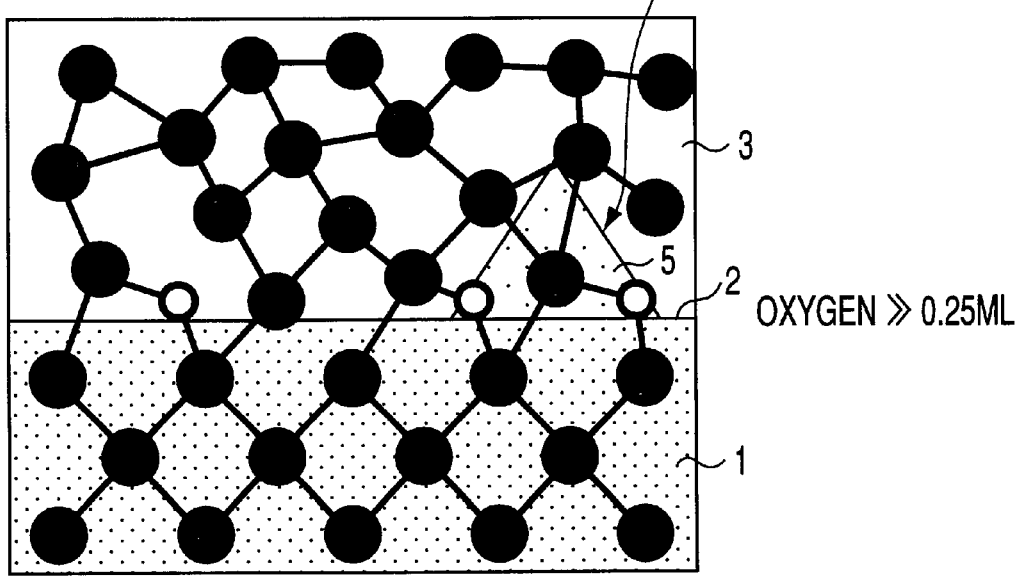
FIG. 9 is a diagram showing a crystal model indicating generation of SPE suppression region in a case where the interface oxygen concentration is high.

Crystal models shown in FIGS. 8 and 9 are used to describe the reason why the optimum range for the interface oxygen concentration shown in FIG. 3 occurs when solid phase growth of high-quality silicon single crystal is, by the SPE method, performed from amorphous silicon deposited by the vapor phase growth method.

As shown in FIGS. 3 and 5, there is estimation that the optimum interface oxygen concentration is about 0.25 ML ($3.3 \times 10^{14}$ cm$^{-2}$) for obtaining a silicon single crystal layer exhibiting a low defect density when the solid phase growth of the amorphous silicon layer to the silicon single crystal layer is performed. As shown in FIG. 3, when the interface oxygen concentration is lower than the lower limit of the optimum range, increase in the defect density starts. When the interface oxygen concentration is higher than the upper limit of the optimum range, increase in the defect density starts again.

FIGS. 8 and 9 are schematic views showing a state where the amorphous silicon layer 3 is, by the vapor phase growth method, deposited on the silicon substrate 1 through mediation of the oxide layer 2, in which the interface oxygen concentration is lower than the monomolecular layer. Closed circles indicate silicon atoms and open circles indicate oxygen atoms. Silicon atoms and oxygen atoms are bonded to one another. In the silicon substrate 1, silicon atoms are regularly arranged. In the amorphous silicon layer 3, silicon atoms are randomly arranged.

As shown in FIG. 8, when the interface oxygen concentration is lower than the lower limit of the optimum range (when interface oxygen concentration <<0.25 ML), very small number of oxygen atoms covers the interface. Therefore, during deposition of amorphous silicon layer 3 by the vapor phase growth method in the low temperature region of 550° C., anomalous growth of a partly crystallized region 4 from the surface region of the silicon substrate 1 which does not contain any oxygen atom occurs.

That is, when the interface oxygen concentration is lower than the lower limit of the optimum range, a portion in which no oxide is left and a portion in which a relatively large quantity is left are formed on the surface of the silicon substrate 1. In the portion in which no oxide film is left, crystallization occurs quickly. In the portion in which a relatively large oxides are left, the crystallization is slowed and deposition in the amorphous state occurs.

In the region in which deposition of the amorphous state occurs, the deposition rate is higher because a large number of dangling bonds are present on the surface. Therefore, the film is thickened correspondently. Hence it follows that stress is caused from nonuniform crystal growth during the next crystallization process of the amorphous silicon region by the SPE method. Thus, it can be considered that dislocations generate easily.

Therefore, as shown in the TEM micrograph of the cross section shown in FIG. 6, the silicon epitaxial single crystal layer formed by, at 700° C., performing heat treatment of the amorphous silicon layer in which the interface oxygen concentration is $5 \times 10^{13}$ cm$^{-2}$ (<<0.25 ML) at a deposition temperature of 550° C. encounters occurrence of dislocations in the direction of the growth. In the region in which dislocations occurred, the film thickness is enlarged. Thus, roughness of the surface are formed, causing the following device formation process to be obstructed.

As shown in FIG. 9, when the interface oxygen concentration is higher than the upper limit of the optimum range (>>0.25 ML), the possibility that the adjacent silicon atoms are bonded to oxygen atoms is raised. Since bonding between the silicon atoms and oxygen atoms deforms tetragonal structure of silicon single crystal, SPE suppression regions 5 are formed at the interface of the amorphous silicon layer 3.

Since the interface oxygen concentration is high, formation of the partly crystallized region 4 shown in FIG. 8 is suppressed during deposition of the amorphous silicon layer 3. Therefore, the deposition rate in the amorphous state is uniformed. As a result, a flat amorphous silicon layer can be obtained.

Since the SPE suppression regions 5, however, are present at the interface between the silicon substrate 1 and the amorphous silicon layer 3, a stacking fault occurs owing to the strain of the SPE suppression regions 5 in the following crystallization process of the amorphous silicon layer 3 by the SPE method.

As shown in the TEM micrograph of the cross section shown in FIG. 7, the silicon epitaxial single crystal layer formed by performing heat treatment at 700° C. of the amorphous silicon layer in which the interface oxygen concentration is $2 \times 10^{15}$ cm$^{-2}$ (>>0.25 ML) at a deposition temperature of 550° C. has a flat surface. Although the single crystalline nature of the base single crystal substrate is transferred to the epitaxial layer, twin boundaries are formed at a high density owing to the stacking faults at the interface. Thus, the following device formation process is obstructed.

The reason why the silicon epitaxial single crystal layer having the high defect density in spite of maintaining the surface flatness is formed will now be described. The high interface oxygen concentration causes a multiplicity of portions to which the base crystallinity is interrupted and in which the epitaxial growth is inhibited, that is, SPE suppression regions 5 are formed during the process for crystallizing the amorphous silicon layer by the SPE method. Thus, a stacking fault occurs, causing twin boundary to generate.

When the interface oxygen concentration is much higher, the crystallinity of the substrate is perfectly interrupted. Thus, the deposited amorphous silicon layer is brought into a polycrystalline state. The reason for this lies in that random generation of growth nuclei occurs during the crystallization process of the amorphous silicon layer during the annealing for SPE.

When the interface oxygen concentration is the optimum value of 0.25 ML, the possibility that the partly crystallized region 4 or the SPE suppression region 5 are formed at the interface of the amorphous silicon layer 3 deposited by the vapor phase growth or the like is made to be lowest. Therefore, the amorphous silicon layer 3 is flat deposited on the process for manufacturing a shrinked silicon device. When the method according to the present invention is employed, the temperature at which the silicon epitaxial single crystal layer is formed can be controlled to about 700° C. which is the temperature at which the silicon single crystal is grown by the SPE method. Therefore, the process can be employed as a portion of the process for manufacturing a shrinked silicon device.

In the first and second embodiments, a polysilicon layer may be deposited in the low-temperature region as a substitute for deposition of the amorphous silicon layer. Then, the interface oxygen concentration is similarly adjusted to the optimum range, and then the SPE method in the low-temperature region is employed to change the amorphous silicon layer into a single crystal. Also in the foregoing case, a satisfactory silicon epitaxial single crystal layer can be formed.

The polysilicon layer is formed by imparting a local order to the atomic arrangement of silicon in the amorphous state. The degree of the local order of the polysilicon layer can be controlled by changing the deposition condition of the polysilicon. Therefore, similarly to the first and second embodiments, the polysilicon layer deposited in the low-temperature region is used to easily obtain the silicon epitaxial single crystal layer. As a matter of course, the silicon substrate 1 during the deposition process. During the single crystal formation by the SPE method, the base crystallinity is transferred to the epitaxial layer. As a result, a high-quality silicon epitaxial single crystal layer exhibiting excellent crystallinity can be obtained.

As described above, formation of the silicon epitaxial single crystal layer is divided into two process steps one of which is deposition of amorphous silicon in the low-temperature region and the other is the formation of single crystal in the low-temperature region by the SPE method. Moreover, the interface oxygen concentration (the amount of native oxide film) is controlled to satisfy the optimum range. As a result, a satisfactory silicon epitaxial single crystal layer can be formed.

When the silicon epitaxial single crystal layer is formed by employing the CVD method in a usual high-temperature region at about 1000° C., the crystallinity of the epitaxial layer deteriorates monotonously with increase of the interface oxygen concentration. Therefore, perfect reduction of the interface oxygen is required by removing oxygen from the surface of the silicon substrate with hydrogen at about 1000° C. as a pretreatment of the CVD process.

As described above, employment of the high-temperature process at about 1000° C. is inhibited in the foregoing silicon epitaxial single crystal layer is employed as a portion of the process for manufacturing the shrinked silicon device.

Figure 10:
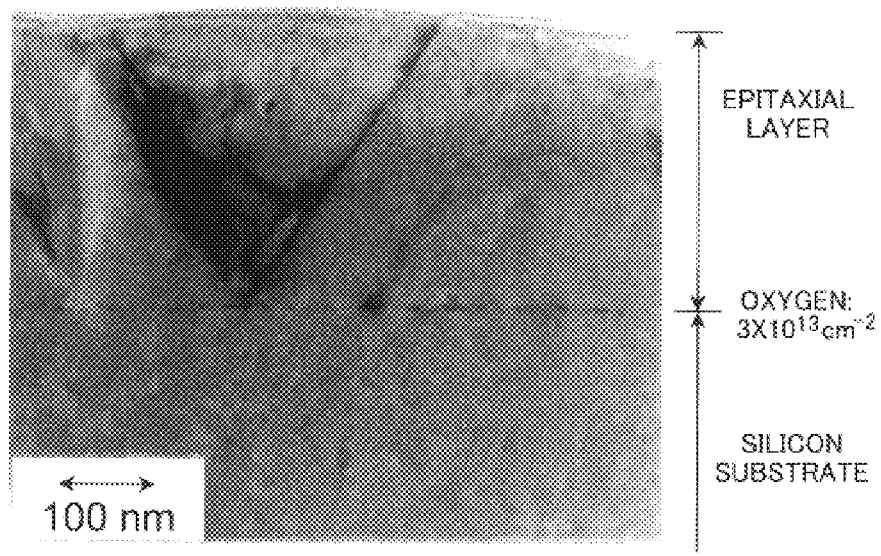
FIG. 10 is a TEM micrograph showing the cross section of an epitaxial layer having defects which have occurred in a case where the deposition temperature is 700° C.

Referring to FIG. 10, a third embodiment will be described. In the third embodiment, the deposition temperature of the silicon film is raised to 700° C. At this temperature, crystallization of the deposited layer occurs instead of deposition in the amorphous state. The crystallinity of the obtained silicon epitaxial single crystal layer will now be described.

As described above, the deposition temperature of the silicon layer is raised from 550° C. to 700° C. It has been clarified that twin boundaries, not observed for deposition in the amorphous state, are formed in the epitaxial layer. A result of the observation by using the cross sectional TEM is shown in FIG. 10.

When the deposition temperature is high, crystallization occurs simultaneously with deposition of the silicon layer. Therefore, the amorphous state is not realized. Therefore, a state substantially similar to the vapor phase epitaxial growth called the CVD method is performed. Therefore, the practically available temperature range in the deposition and crystallization processes of this invention is from 550° C. to 800° C.

As described above, the growth process of the silicon epitaxial single crystal layer by the CVD method usually unables the epitaxial growth if a native oxide film is left even in a small amount. If the native oxide film is left even in a small amount, crystallization in the region is obstructed. Therefore, crystallization proceeds in only the outside portion of the region.

The partly crystallized region in which the amount of the native oxide film is small extends above the region in which the native oxide film is present in a large amount so as to be bonded to each other. It is considered that dislocations occur because the crystal axes do not completely coincide with each other owing to the presence of a region in which a large amount of the native oxide film is present. To suppress occurrence of the dislocations, heat treatment must be performed at a high temperature near 1000° C. so as to completely remove oxygen from the surface of the substrate. Therefore, employment of the foregoing step in the device manufacturing process in which the processing temperature has the upper limit is very difficult.

As described above, the first and second embodiments are structured such that deposition of the silicon layer is performed in a state of amorphous silicon or polysilicon. Moreover, the following epitaxial growth process is performed by the SPE method with which phase transition occurs from the amorphous state or the polysilicon state similar to the amorphous state to the single crystal state.

With the SPE method, even if oxygen is left at the interface, crystallization proceeds while the flat growing front is being maintained unless the residual oxygen concentration is not too high. Therefore, occurrence of any defect can be prevented. Hence it follows that a high-temperature heat treatment step, such as hydrogen annealing for removing oxygen, is not required. As a result, a high-quality silicon epitaxial single crystal layer free from any defect can be formed.

According to the first embodiment or the second embodiment, a silicon substrate incorporating a satisfactory silicon epitaxial single crystal layer formed through the silicon oxide film can be obtained only by adding the formation and control steps of the native oxide film at the interface.

A fourth embodiment of the present invention will now be described. In the fourth embodiment, a method of applying the structure according to the first or the second embodiment is to a process for manufacturing a silicon substrate having a SOI structure, such as SIMOX, will be described.

As described in the first and second embodiments, the fourth embodiment has a structure that a silicon epitaxial single crystal layer is formed on a silicon single crystal substrate through mediation of a native oxide film, the film thickness of which is controlled to satisfy an optimum range which is smaller than the mono-molecular layer. Then, the silicon epitaxial single crystal layer is subjected to heat treatment in a low-temperature region for a predetermined time in an oxygen atmosphere. Thus, a satisfactory silicon substrate having the SOI structure, such as SIMOX, can be obtained.

The heat treatment (post oxidation) in the low-temperature region is performed for a predetermined time in the oxygen atmosphere. Thus, oxygen is supplied to the native oxide film at the interface from the surface of the silicon epitaxial single crystal layer. As a result, the native oxide film at the interface can be thickened.

It is considered that the foregoing phenomenon occurs because oxygen is thermally diffused through the silicon epitaxial single crystal. Thus, oxygen is supplied to the native oxide film at the interface between the epitaxial layer and the silicon substrate.

When the foregoing phenomenon is used, control of the temperature and time of the post oxidation enables the film thickness of the oxidized film at the interface between the silicon epitaxial layer and the silicon substrate to be controlled. As a result, a silicon substrate having the SOI structure, such as SIMOX, can be provided at a high manufacturing yield.

The conventional SOI structure, such as SIMOX, has been formed by a step of implanting high energy and high dose oxygen ions from the surface of the silicon single crystal substrate to form a layer in which a large amount of oxygen has been implanted into the substrate. Then, the layer is subjected to heat treatment so as to form a thick oxidized film in the substrate.

At this time, oxygen ions having high energy cause damage to the surface layer of the silicon single crystal substrate. Even after the heat treatment has been performed, the damage cannot be recovered. Therefore, a surface layer composed of satisfactory silicon single crystal cannot be formed on the thick oxide film from the SOI structure, such as SIMOX.

When the structure of the fourth embodiment is employed, the heat treatment step at 700° C. or lower is performed. Thus, a silicon substrate incorporating the SOI structure, such as SIMOX, having a satisfactory silicon epitaxial single crystal layer formed on the thick oxide film during the process for forming a semiconductor device can be provided.

Further, the thickness of the interface oxide layer possibly becomes thinner than before after post annealing in the inert gas such as nitrogen or argon without supplying oxygen. This is because the oxygen atoms constituting the interface insulating layer are out-diffused both into the silicon substrate and the epitaxial silicon layer.

In this case, the epitaxial silicon layer, which has perfectly no oxygen atoms remaining at the interface, is formed and can be utilized for high performance semiconductor device fabrication.

A fifth embodiment of the present invention will now be described. The fifth embodiment is a modification of the first and second embodiments. In the fifth embodiment, the same portions as those of the first and second embodiments are omitted from description.

In the fifth embodiment, the diluted hydrofluoric acid step is performed so that a thin oxide layer 2 shown in FIG. 1A is formed. Then, an LPCVD reactor is operated to form an amorphous silicon layer 3 under conditions that the partial pressure of $Si_2H_6$ source gas is 0.3 Torr and the temperature is 480° C. Then, the next single crystallizing step by the SPE method is performed under heat treatment at 600° C. in a nitrogen atmosphere.

The relationship between the interface oxygen concentration and defect density of the formed silicon epitaxial single crystal layer was examined. As a result, it was confirmed that a defect-free silicon single crystal layer was formed when the interface oxygen concentration was $3.3 \times 10^{14}$ cm$^{-2}$.

It was also confirmed that crystal defects occurred when the interface oxygen concentration was $2.5 \times 10^{14}$ cm$^{-2}$ or lower. When the interface oxygen concentration was $5.8 \times 10^{14}$ cm$^{-2}$, polysilicon was formed. As described above, it was confirmed that the range of the interface oxygen concentration in which a satisfactory silicon single crystal layer according to the fifth embodiment was narrow as compared with the first and second embodiments.

The fifth embodiment requires heat treatment at 600° C. or lower in the single crystal formation step by the SPE method. However, formation of the amorphous silicon layer by the vapor phase growth method can be performed at a low-temperature region of 480° C. Therefore, the method according to the fifth embodiment is an effective method when silicon epitaxial growth must be performed during the process for manufacturing a semiconductor device.

The reason why the fifth embodiment encounters narrowing of the interface oxygen concentration range in which a satisfactory silicon epitaxial single crystal layer can be obtained will now be described. Since the substitution of the source gas changed from $SiH_4$ to $Si_2H_6$ having a high reducing properties, localization of surface oxygen occurs in an initial deposition stage of the amorphous silicon layer. Thus, defects easily occurs in the deposited layer.

Figure 11:
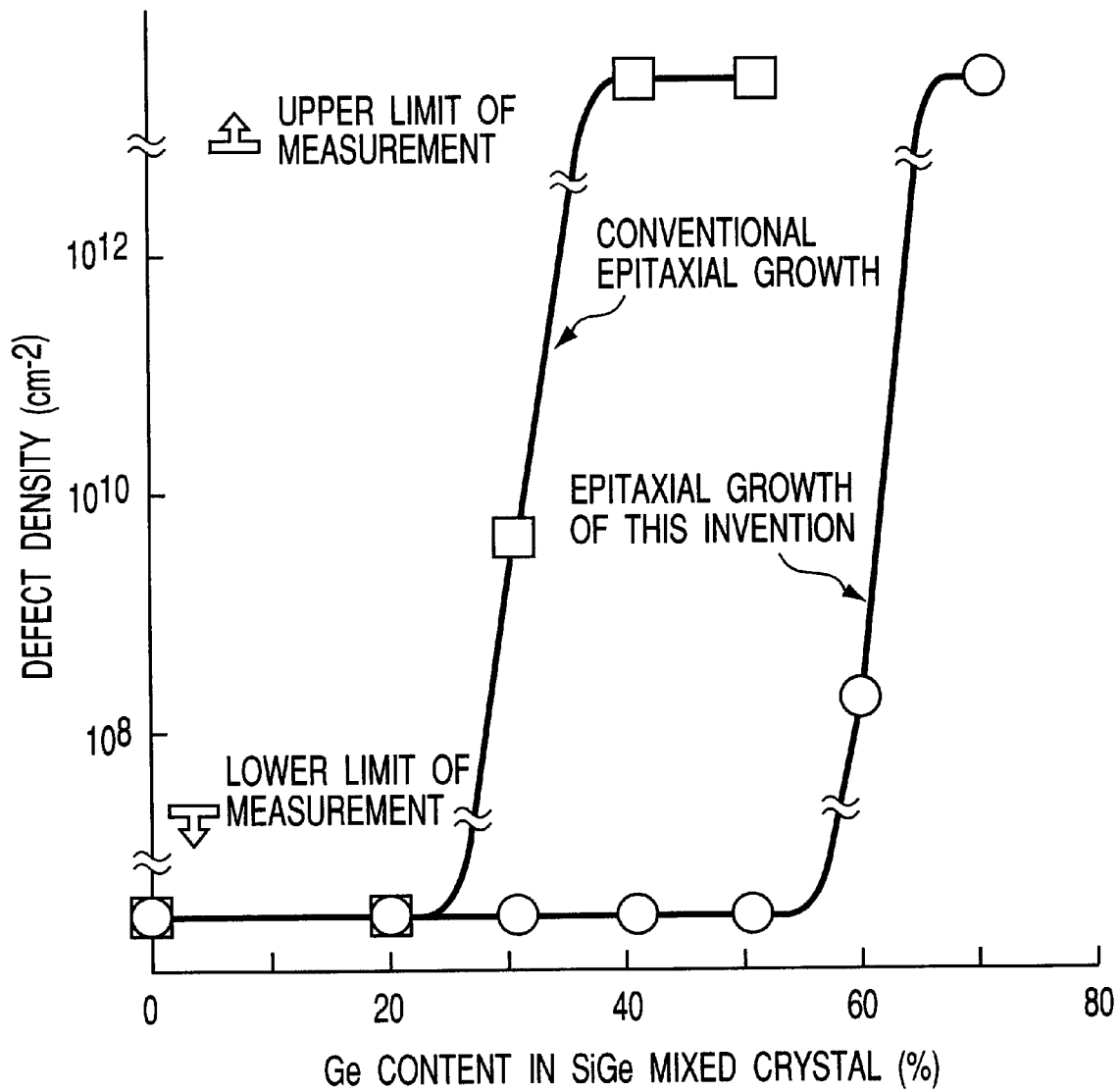
FIG. 11 is a graph for making a comparison of the relationship between the Ge content and defect densities realized in a case of a SiGe epitaxial growth according to a sixth embodiment and that in a case of a conventional SiGe epitaxial growth.

Referring to FIG. 11, a sixth embodiment will now be described. Referring to FIG. 11, the same portions as those of the first and second embodiments are omitted from description.

Similarly to the first and second embodiments, the sixth embodiment has a structure that the thin native oxide film having a controlled film thickness is formed on the silicon single crystal substrate. Then, an amorphous silicon SiGe layer containing Ge at an atomic composition ratio of 40% is deposited. Note that deposition of the amorphous SiGe layer is performed by operating the LPCVD reactor using a mixed gas of $SiH_4$ and $GeH_4$ at a temperature of 520° C.

Then, epitaxial growth of amorphous SiGe is performed by the SPE method under conditions that the temperature is 650° C. and duration is 30 minutes in a nitrogen atmosphere. Thus, a SiGe single crystal layer free from any defect, such as dislocations, can be obtained.

In general, high concentration of Ge inhibits easy formation of a SiGe epitaxial single crystal layer free from defects. When the amount of Ge to be added to Si is increased, the lattice constant is enlarged. Thus, lattice strain occurs at the interface between the silicon substrate and the SiGe epitaxial single crystal layer.

In the sixth embodiment, a Ge composition range in which a defect-free SiGe epitaxial single crystal layer was obtained. The composition of Ge was sequentially changed to evaluate the crystallinity realized after the heat treatment for forming single crystal which was performed by the SPE method at 650° C. for 30 minutes. As a result, it was found that formation of a defect-free SiGe silicon epitaxial single crystal layer was permitted until the atomic composition ratio of Si and Ge reached 50%:50%, as shown in FIG. 11.

When the native oxide film is not formed and the deposition temperature is raised to 620° C. to form the SiGe single crystal layer by the vapor phase epitaxial growth method, a defect occurs in the SiGe silicon epitaxial single crystal layer in only a case where the atomic composition ratio of Ge is 20% or lower as occurred in the conventional epitaxial growth shown in FIG. 11.

The reason why the foregoing difference occurs will now be described. Since the SPE is performed through the native oxide film at the interface, strain between the substrate and the epitaxial growth layer can be released. Although the lattice constants are different from each other, heteroepitaxial growth of the SiGe single crystal layer on the silicon single crystal substrate is permitted. Note that epitaxial growth of SiGe containing Ge at a high concentration is usually difficult.

The structure of the sixth embodiment was effective when Si containing C (carbon) was used. When C is doped as a substitute for Ge or when both Ge and C are doped, the lattice constant is changed as compared with a case where Si is solely used. Therefore, lattice strain occurs between the base silicon single crystal substrate and the SiGe single crystal layer. When the structure according to the sixth embodiment was employed, the foregoing defects did not occur in the silicon epitaxial single crystal layer. Thus, satisfactory crystallinity was realized.

It was also found that formation of the epitaxial layer having the structure incorporating the native oxide film at the interface attains the following advantages: epitaxial SiGe single crystal layers each containing Ge by 20% and having a film thickness of 500 nm were manufactured. Either of the layers had the native oxide film at the interface, the other layer did not have the native oxide film. Then, heat treatment was performed in an argon atmosphere at 1000° C. for 30 minutes.

The crystallinity of the sample subjected to the heat treatment was evaluated. The sample incorporating the native oxide film at the interface was free from any change in the crystallinity of the epitaxial SiGe single crystal layer. On the other hand, the sample which did not have the native oxide film at the interface encountered formation of dislocations in the silicon single crystal substrate as well as the inside of the epitaxial SiGe single crystal layer.

The reason why the native oxide film formed in the epitaxial interface prevents occurrence of defects is because the presence of the native oxide film releases the lattice strain at the interface between the silicon single crystal substrate and the SiGe silicon epitaxial single crystal layer.

It was also found that the native oxide film at the interface has a function which is capable of blocking impurity diffusion from the SiGe silicon epitaxial single crystal layer. The foregoing function is very advantageous as a device formation process from a viewpoint of maintaining a steep doping profile immediately after the silicon epitaxial single crystal layer has been formed.

The foregoing effects obtained from the native oxide film formed at the epitaxial interface is not limited to the Si/SiGe heteroepitaxial layer according to the sixth embodiment. As a matter of course, a similar effect can be obtained when it is applied to the Si/Si homoepitaxial layer according to the first and second embodiments.

As for addition of a different type element to the silicon epitaxial single crystal layer, the different type element is not limited to Ge. For example, a similar effect can be obtained when an amorphous silicon layer into which an impurity, such as B, P or As, has been doped is deposited. Then, the SPE method is employed to perform formation of single crystal.

The usual CVD process or the like is employed to perform crystallization so that the native oxide film is removed and the crystallization is performed simultaneously with the deposition including a high concentration of impurity. In this invention, however, the amorphous silicon layer to which the impurity has been added in high concentration is deposited. Then, the SPE method is employed to perform crystallization so that the thickness controlled native oxide film is formed therebetween. As compared with the foregoing usual method, a silicon epitaxial single crystal layer having satisfactory crystallinity can be obtained according to the sixth embodiment even if the high-concentration impurity is doped.

Furthermore, as compared with the foregoing layer, higher-density doping is permitted. Therefore, when the method according to the sixth embodiment is employed, a SiGe silicon epitaxial single crystal layer free from defects can be realized. Moreover, a silicon epitaxial single crystal layer having low resistance required to improve the device performance can be formed.

Referring to FIGS. 12A to 12D, a MOS transistor having an elevated S/D structure according to a seventh embodiment and a manufacturing process therefor will now be described. FIGS. 12A to 12D are cross sectional views showing the manufacturing steps.

Figure 12A:
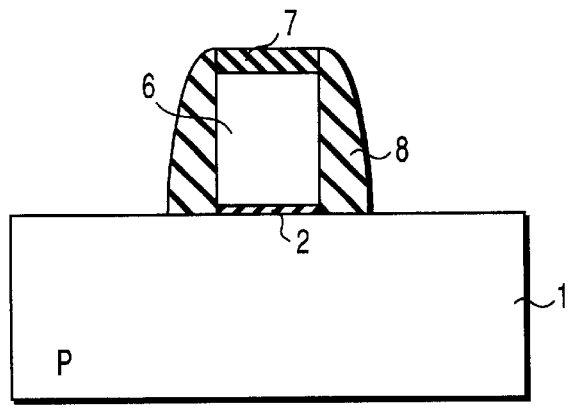
FIGS. 12A to 12D are cross sectional views showing steps for manufacturing a MOS transistor having an elevated S/D structure according to a seventh embodiment of the present invention.

As show in FIG. 12A, a gate oxide film 2 is formed on a semiconductor substrate 1 made of silicon and so forth by, for example, thermal oxidation. Then, a polysilicon layer which is the material of a gate electrode 6 is deposited on the gate oxide film 2. An etching mask constituted by, for example, a silicon nitride (SiN) film 7 for patterning the gate electrode 6 is formed on the upper surface of the polysilicon layer.

The silicon nitride film 7 is used as a mask to perform anisotropic etching, for example, RIE (Reactive Ion etching) so as to perform formation of the gate electrode 6 made of polysilicon. At this time, the gate electrode 6 is used as a mask to simultaneously remove the gate oxide film 2 on the semiconductor substrate except for the portion below the gate electrode. Then, a silicon nitride film or the like which is the material of a gate sidewall insulating film 8 is deposited on the overall surface. Then, RIE anisotropic etching is performed so that the sidewall insulating film 8 is formed.

Figure 12B:
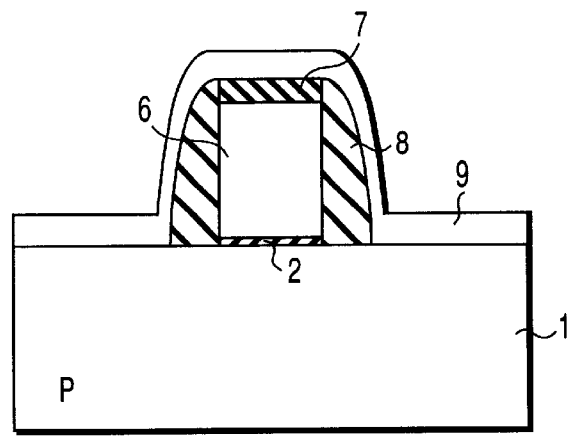

Then, as shown in FIG. 12B, deposition of an amorphous silicon layer 9 on the principal plane is performed in the LPCVD reactor at lower temperatures than 740° C., preferably lower than 600° C. to cover the silicon nitride film 7 on the gate electrode 6 and the sidewall insulating film 8.

At this time, pretreatment of the foregoing deposition step is performed by the method according to the first and second embodiments. Thus, a native oxide film (not shown) having a controlled film thickness such that a predetermined interface oxygen concentration in the range from $3\times10^{11}$ cm$^{-2}$ to $1.1\times10^{15}$ cm$^{-2}$ is formed on the exposed semiconductor substrate 1.

In case of applying the epitaxial growth technology by using the native oxide to form the elevated S/D structure, the amount of the interface oxygen is not limited to the preferable range for obtaining the high quality epitaxial silicon layer as shown in the first and second embodiments.

The epitaxial silicon layer used for the elevated S/D structure, however, is not necessarily to be a high quality single crystalline state. Accordingly, a wider range of the interface oxygen amount is available for applying this invention to the elevated S/D formation.

Specifically, an extremely wide range of the interface oxygen amount, from $3\times10^{11}$ cm$^{-2}$ to $1.1\times10^{15}$ cm$^{-2}$ is shown to be effective for the elevated S/D formation, and the available temperature range in the deposition and crystallization processes is from 550° C. to 800° C.

Figure 12C:
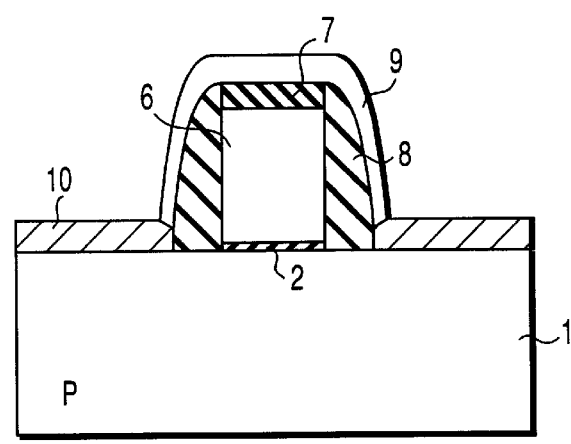

Then, as shown in FIG. 12C, SPE heat treatment is performed in an H$_2$ atmosphere in the LPCVD reactor. Thus, solid phase growth starts at the portion directly deposited on the exposed portion of the principal plane of the semiconductor substrate 1. Therefore, the amorphous silicon layer 9 is changed into single crystal layer 10 in a direction of the film thickness.

Then, a portion of the amorphous silicon layer 9, which has not been changed into single crystal in the LPCVD reactor and which is formed on the silicon nitride film and the sidewall insulating film 8, is selectively removed by an etching operation using a HCl gas diluted to about 10% by H$_2$. As described above, the silicon single crystal layer 10 is selectively formed in the source/drain region of the semiconductor substrate 1.

Specifically, the removing step of the amorphous silicon layer remained on the insulating film is performed by using the etching gas atmosphere of diluted HCl from 1% to 50% by H$_2$, in the pressure range from 10 mTorr to 800 Torr, and in the temperature range higher than 600° C. and lower then 900° C.

Figure 12D:
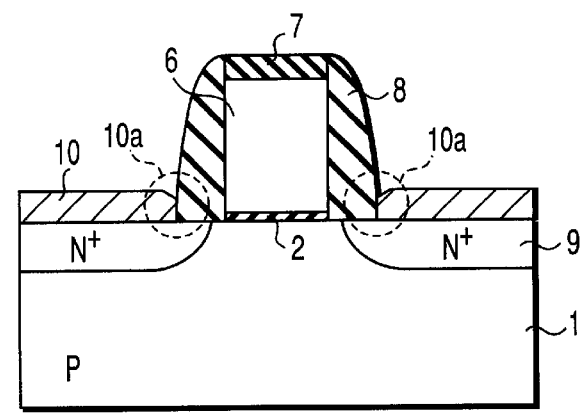

Then, as shown in FIG. 12D, the gate electrode 6 covered with the sidewall insulating film 8 and the silicon nitride film 7 is used as a mask to implant and diffuse ions into a source/drain formation region. Thus, the source/drain region 9 of the semiconductor substrate 1 is formed.

As described above, ion implantation into the source/drain formation region is performed through the silicon single crystal layer 10. Therefore, the shallow source/drain region 9 of the semiconductor substrate 1 can be formed. Since the impurity is also doped in high concentration to the silicon single crystal layer 10, a required elevated S/D structure MOS transistor can be formed.

The foregoing steps are formed, and the heat treatment at temperatures lower than 800° C. is performed. Thus, a MOS transistor having the elevated S/D structure according to the seventh embodiment is formed. Thus, application to a ultra-fine structured MOS transistor having a gate length of 0.1 μm or shorter is permitted.

An elevated S/D structure shown in FIG. 12D has facets formed at positions at which the silicon single crystal layer 10 and an end portion of the sidewall insulating film 8 are in contact with each other as indicated with dashed-line circles 10a. Formation of the facets sometimes exerts an adverse influence on the reliability of the elevated S/D structure MOS transistor. A means for preventing the facet formation will be described in tenth and eleventh embodiments.

Referring to FIGS. 13A to 13K, an eighth embodiment will now be described. FIGS. 13A to 13K are cross sectional views showing steps of a process for manufacturing a semiconductor device incorporating a MOS transistor having an elevated S/D structure according to the eighth embodiment.

As shown in FIG. 13A, ions of N-type impurity, such as As (arsenic) is implanted to a P-type semiconductor substrate 11 made of, for example, silicon. Then, thermal diffusion is performed so that an N-type region (an N-well) 12 having a depth of about 1 μm is formed.

Then, a shallow trench is formed in a predetermined region of the semiconductor substrate 11, as shown in FIG. 13B. Then, a silicon oxide film having a film thickness of about 300 nm is embedded and planarized. Thus, a device isolation region 13 having a STI (Shallow Trench Isolation) structure is formed.

Then, as shown in FIG. 13C, a protective film 14 constituted by a silicon oxide film having a film thickness of about 10 nm is formed on the semiconductor substrate 11. Then, ion implantation 15 is performed in order to make the threshold voltage of the MOS transistor to coincide with a designed voltage.

Then, as shown in FIG. 13D, the protective film 14 is removed, and then a gate oxide film 16 constituted by a silicon oxide film or the like having a film thickness of several nm is again formed. The gate oxide film 16 may be an oxynitride film containing nitrogen by several % or a tantalum oxide film.

Figure 13E:
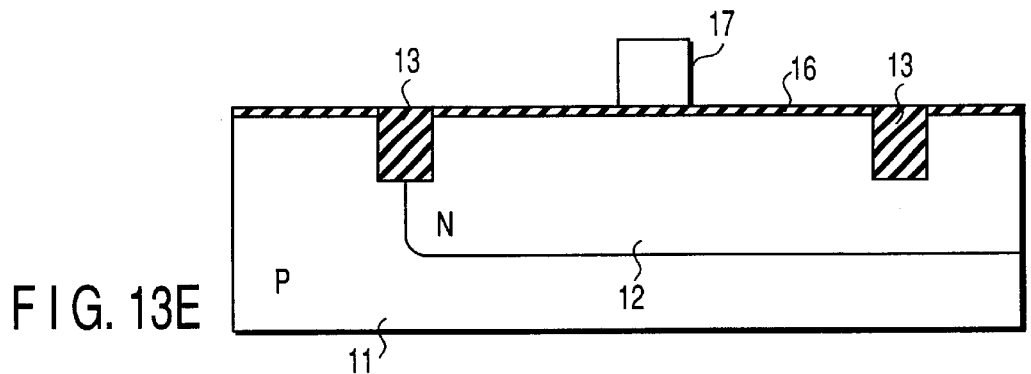

Then, as shown in FIG. 13E, for example, a CVD method is employed to deposit a polysilicon layer having a film thickness of about 150 nm. A photoresist (not shown) is used as a mask to perform etching by RIE. Thus, a gate electrode 17 having a required shape is formed.

Figure 13F:
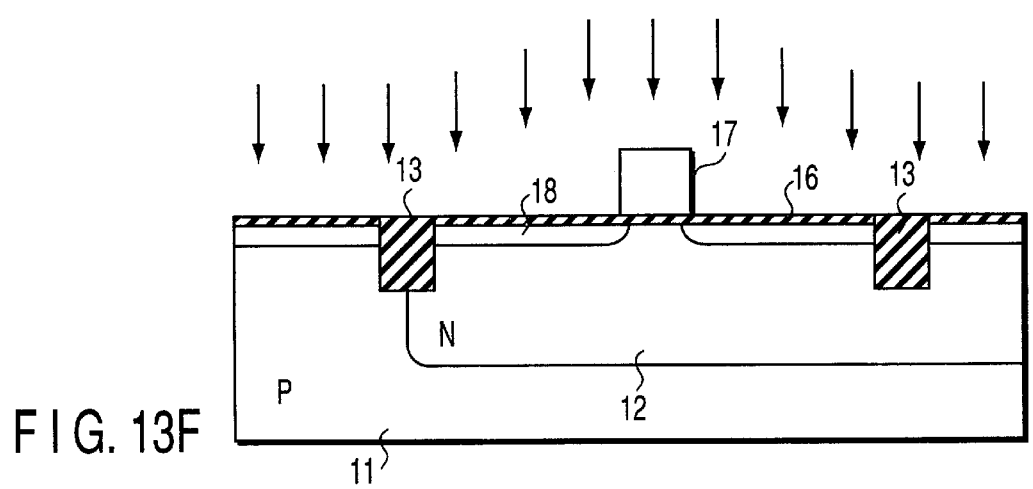

Then, as shown in FIG. 13F, re-oxidation is performed to remove RIE damage and to reduce the crowding of electric fields at the end of the gate electrode 17. Then, implantation of $BF_2$ ions is performed under conditions that the accelerated voltage is 10 keV and the amount of dosing is $5 \times 10^{14}$ cm$^{-2}$. Thus, a P-type LDD (Lightly Doped Drain) region 18 is formed. The P-type LDD region 18 has an effect to reduce the intensity of the electric field of the PN junction in the S/D region of the MOS transistor to suppress hot electron effects.

Figure 13G:
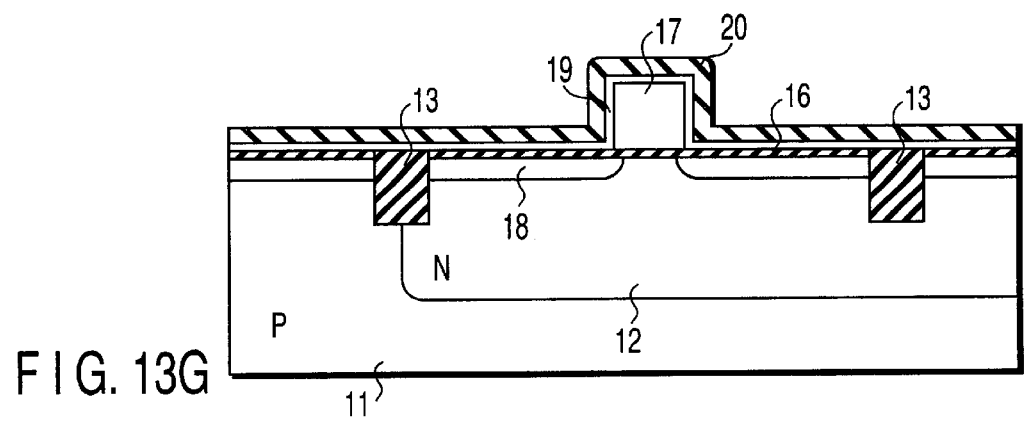

Then, as shown in FIG. 13G, for example, the LPCVD method is employed to deposit a silicon oxide film having a film thickness of about 10 nm. Then, the re-oxidized film is added so that a liner layer 19 is formed. Then, the LPCVD method is employed to deposit a silicon nitride film 20 having a film thickness of 50 nm such that satisfactory coverage of the liner layer 19 is realized.

Figure 13H:
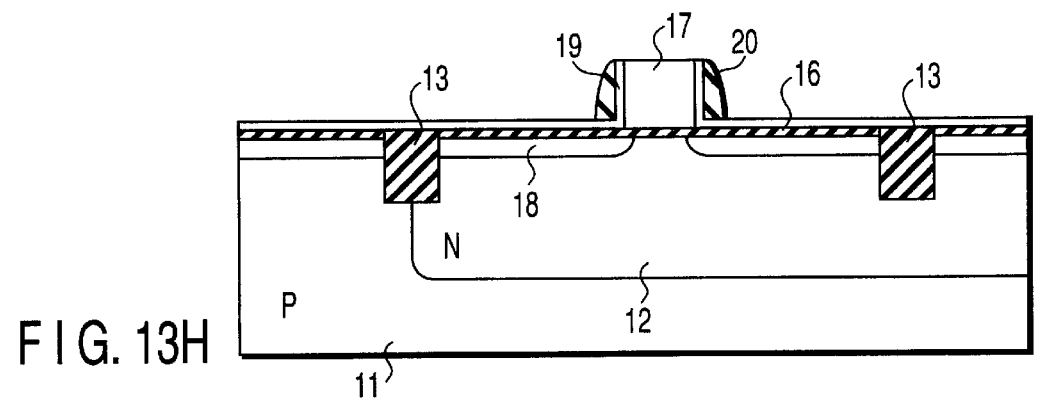

Then, as shown in FIG. 13H, the RIE is performed so that the overall surface is etched. Thus, the silicon nitride film is left on only the sidewall of the gate so that the gate sidewall insulating film 20 is formed. At this time, the liner layer 19 serves as an etching stopper when the silicon nitride film 20 is RIE-etched.

Then, an elevated S/D structure MOS transistor is formed by performing silicon selective epitaxial growth in the S/D formation region. To perform the epitaxial growth, the crystallinity of the semiconductor substrate 11 must be transferred to the epitaxial layer. Therefore, the gate oxide film 16 and the silicon nitride film 20 left on the S/D formation region must be removed.

Figure 13I:
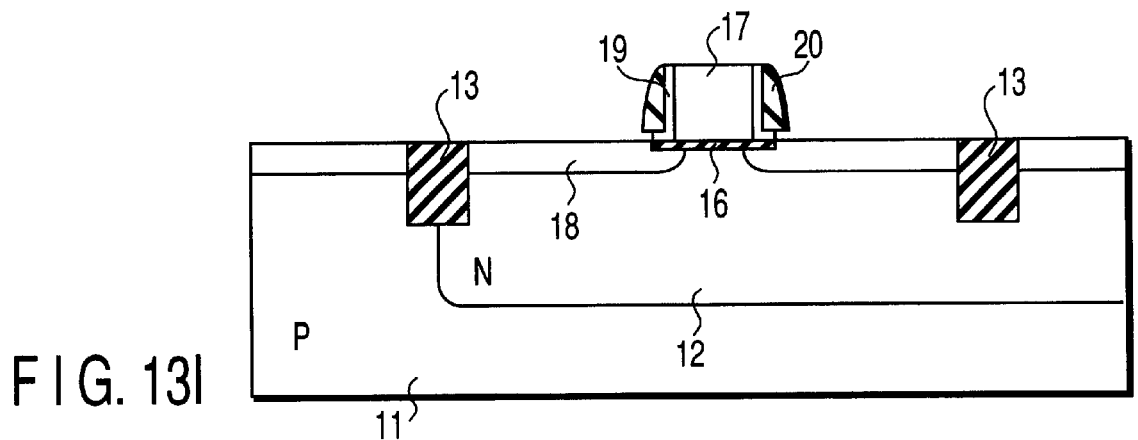

Then, as shown in FIG. 13I, etching is performed by using diluted hydrofluoric acid or the like before the selective epitaxial layer is formed. Thus, the gate oxide film 16 and the silicon nitride film 20 on the S/D formation region are previously removed. As a result, the gate oxide film 16 and the silicon nitride film 20 are formed below the gate electrode 17 and on the gate sidewall 20.

Then, pretreatment of the selective epitaxial deposition process is performed such that the method according to the first and second embodiments is employed to form a native oxide film (not shown) having a controlled film thickness on the exposed surface of the semiconductor substrate such that interface oxygen concentration is realized which is in the range from $3 \times 10^{11}$ cm$^{-2}$ to $1.1 \times 10^{15}$ cm$^{-2}$.

Figure 13J:
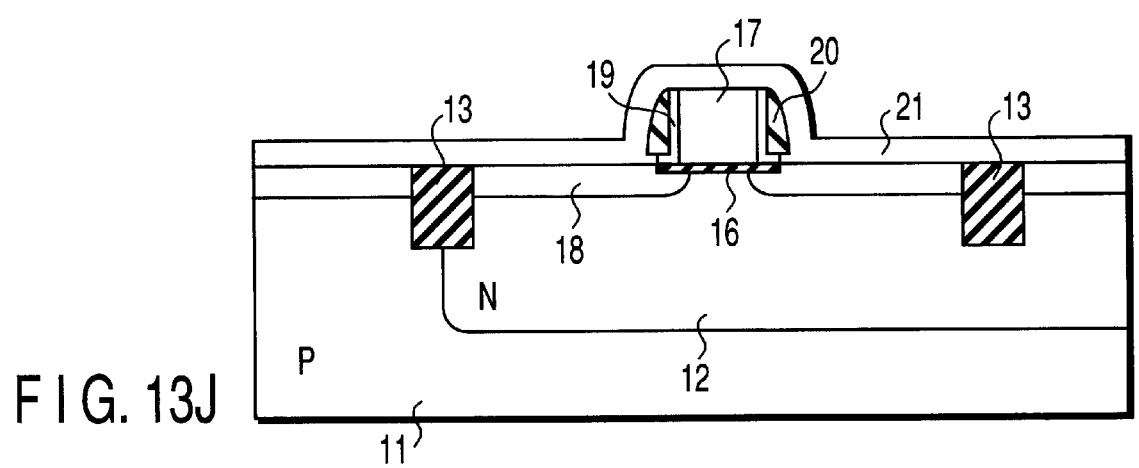

Then, as shown in FIG. 13J, the LPCVD reactor is operated to deposit an amorphous silicon layer 21 having a film thickness of 50 nm on the overall surface of the semiconductor substrate 11 by using silane or the like such that satisfactory coverage is realized. As described in the second embodiment, the polysilicon layer may be substituted for the amorphous silicon layer. The deposition temperature at this time is about 600° C.

Figure 13K:
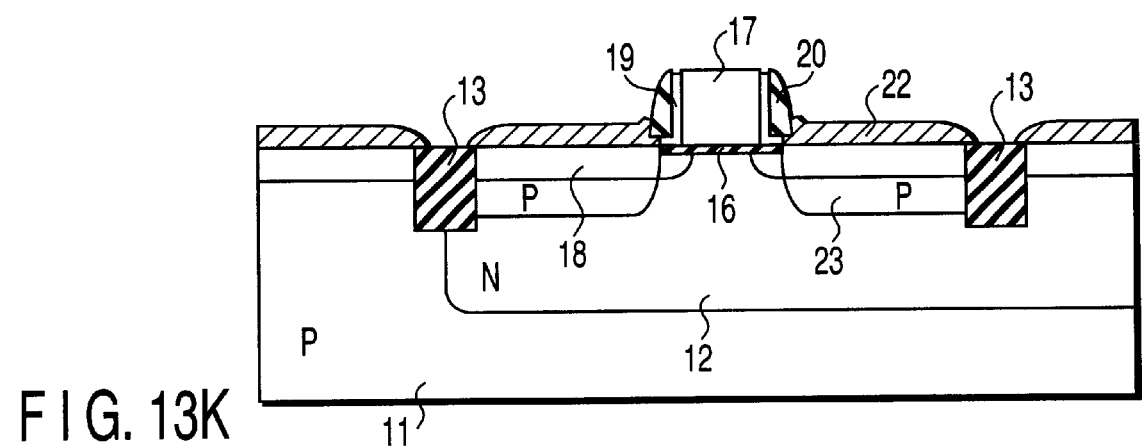

After the deposition step to realize a required film thickness has been completed, supply of a source gas constituted by silane or the like is interrupted. Then, SPE heat treatment in a low-temperature region is performed in an $H_2$ atmosphere to cause the solid phase growth to proceed. Since the solid phase growth occurs in only the region of the amorphous silicon layer 21 which is in contact with the semiconductor substrate 11, only the amorphous silicon layer 21 in the region on the semiconductor substrate 11 in which silicon has been exposed is changed into single crystal. Thus, a silicon single crystal layer 22 shown in FIG. 13K is formed.

At this time, the atmospheric gas during the solid phase growth is not limited to $H_2$. Other gases than $H_2$ may be used as well.

Since the amorphous silicon layer 21 on the silicon nitride film 20 and the device isolation region 13 is not formed into single crystal, that is, only the amorphous silicon layer 21 is, in the same reaction chamber of the LPCVD reactor, removed by etching by using HCl gas diluted from 1% to 50% with $H_2$ in the pressure range from 10 mTorr to 800

Torr. Since the foregoing etching method does not etch the crystallized silicon single crystal layer 22, selective etching of the amorphous silicon layer 21 can be performed. Therefore, an etching selectivity of 10 or larger can be obtained with respect to the silicon single crystal layer 22.

The temperature of the wafer in the etching process is from 600° C. to 900° C. Preferably, the temperature of the etching process is lower than 800° C. from the viewpoint of lowering the process temperature.

Further, the silicon layer 21 is all removed by etching from the top of the gate electrode 17 as shown in FIG. 13K. According to the amount of interface oxygen or etching conditions, however, the silicon layer 21 deposited on the gate electrode 17 sometimes remains unetched.

The remaining of the silicon layer on the gate electrode 17 is caused by the heat treatment for crystallizing the amorphous silicon deposited on the exposed surface of single crystalline silicon substrate through solid phase growth process. During the heat treatment, the deposited amorphous silicon layer 21 on the gate electrode 17 changes to the polycrystalline layer according to the polycrystalline nature of the underlying polysilicon gate electrode 17.

By selecting the optimum etching condition, the crystallized portion on the gate electrode 17 may be removed. However, if the etching condition of lower etching selectivity ratio is adopted for the polysilicon layer, a part of the polysilicon layer remains on the gate electrode 17, and if the etching condition of higher etching selectivity ratio is adopted for the polysilicon layer, a part of the gate electrode may be etched.

Because the amorphous silicon layer on STI 13 composed of insulating film is selectively etched in any case, the etching condition of amorphous or polycrystalline silicon has no influence to form the elevated S/D structure.

The deposition of the amorphous silicon layer 21, the solid phase growth by the SPE method and selective etching can continuously be performed in the same reaction chamber. Therefore, the productivity can considerably be improved. Then, as shown in FIG. 13K, P-type impurity ions are implanted and diffused in the P-type LDD region 18 of the semiconductor substrate 11. Thus, a P-type S/D region 23 of the semiconductor substrate 1 is formed.

The low-temperature heat treatment at 800° C. or lower enables a semiconductor device incorporating the MOS transistor having the elevated S/D structure to be formed. Then, a usual SALICIDE step is performed so that a higher operation speed semiconductor device is formed.

The method of manufacturing a semiconductor device according to the eighth embodiment enables silicon selective epitaxial growth using the solid phase growth to continuously be performed in the same reaction chamber. Therefore, the productivity can considerably be improved. Moreover, the process temperature can be lowered as compared with the conventional selective epitaxial growth method using the vapor phase growth. Therefore, a process can be constituted with which change in the impurity profile in the fine MOS transistor can be prevented and which is free from considerable influence of thermal history.

Referring to FIGS. 14A to 14H, a ninth embodiment will now be described. FIGS. 14A to 14H are cross sectional views showing steps of a method of manufacturing a semiconductor device according to the ninth embodiment. The steps until the step for forming a gate oxide film 36 are similar to those according to the eighth embodiment. That is, a device isolation region 33 is formed on the semiconductor substrate 31. Moreover, an N-well region 32 is formed. A gate oxide film 36 constituted by a silicon oxide film or the like is formed on the principal plane of the semiconductor substrate 31.

Figure 14A:
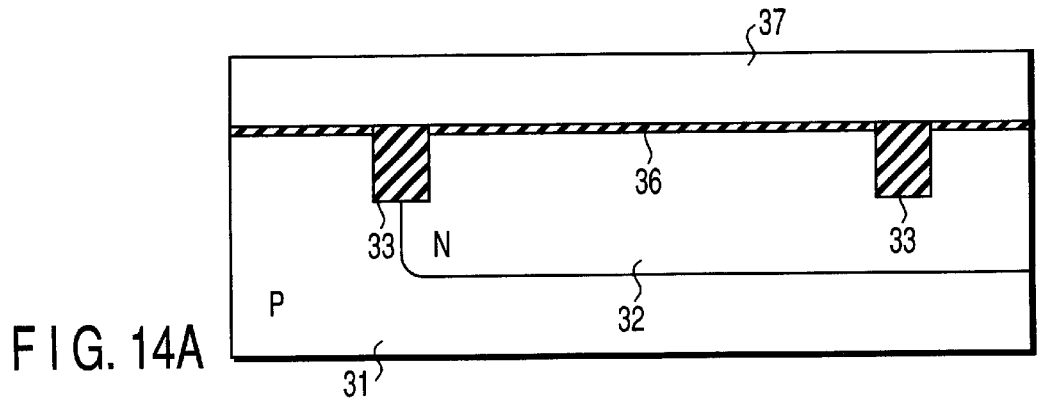
FIGS. 14A to 14H are cross sectional views showing steps of a method of manufacturing a semiconductor device according to a ninth embodiment.

As shown in FIG. 14A, for example, the CVD method is employed to deposit a polysilicon layer 37 having a film thickness of 150 nm.

Figure 14B:
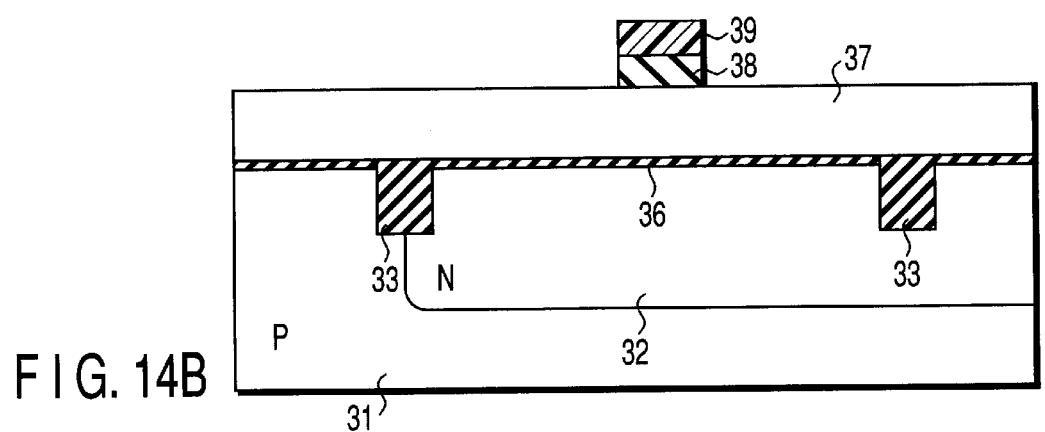
Figure 14C:
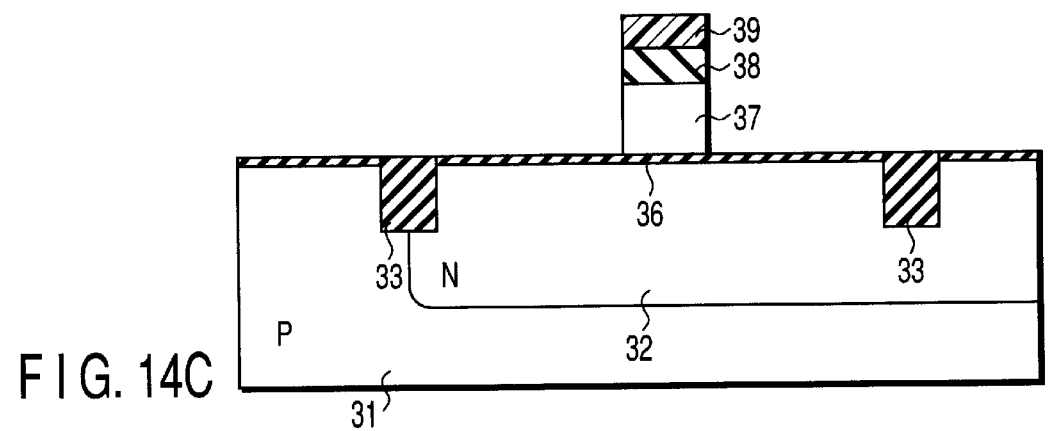

Then, as shown in FIG. 14B, a silicon nitride (SiN) 38 having a film thickness of 50 nm is deposited on the overall surface of the semiconductor substrate 31. A photoresist 39 is used as a mask to etch the silicon nitride film 38. Then, as shown in FIG. 14C, the silicon nitride film 38 is used as a mask to perform RIE so as to anisotropically etch the polysilicon layer 37. Thus, a gate electrode is formed, and then re-oxidation is performed to remove the RIE damage and to reduce the crowding of electric fields at the end of the gate electrode.

Figure 14D:
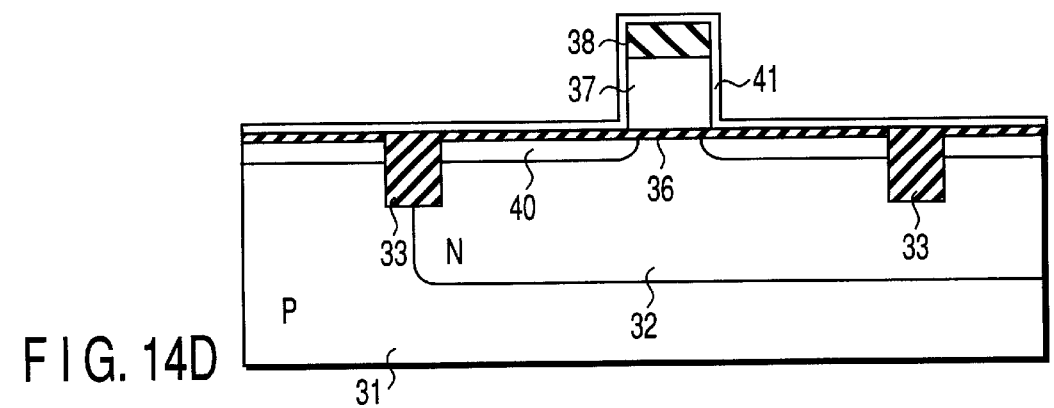

Then, as shown in FIG. 14D, the gate electrode is used as a mask to implant $BF_2$ ions under conditions that the accelerated voltage is 10 keV and the amount of dosing of $5 \times 10^{14}$ cm$^{-2}$. Thus, a P-type LDD region 40 is formed. The P-type LDD region 40 attains an effect to reduce the intensity of the electric field of the PN junction in the S/D region to suppress formation of hot electrons. Then, the LPCVD method or the like is employed to deposit a silicon oxide film having a film thickness of 10 nm on the foregoing re-oxidized film so that a liner layer 41 is formed.

Figure 14E:
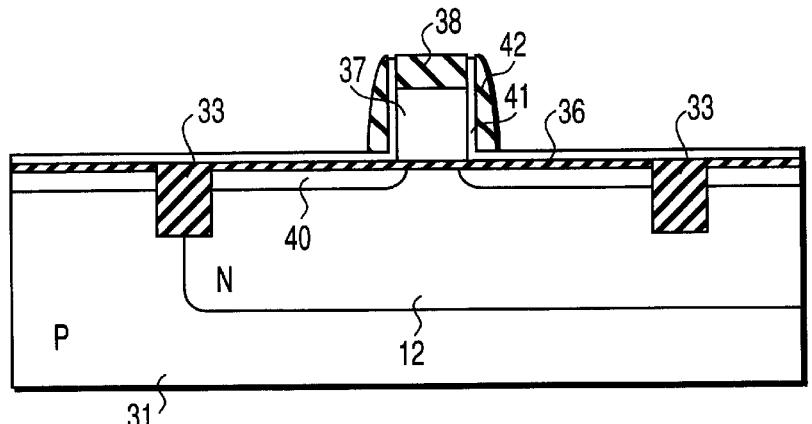

Then, as shown in FIG. 14E, for example, the LPCVD method is employed to deposit silicon nitride film (SiN) having a film thickness of 50 nm such that satisfactory coverage is realized. Then, the RIE method or the like is employed to form a sidewall insulating film 42 such that the silicon nitride film is left only on the gate sidewall. The liner layer 41 serves as an etching stopper when the silicon nitride film is RIE-processed.

Figure 14F:
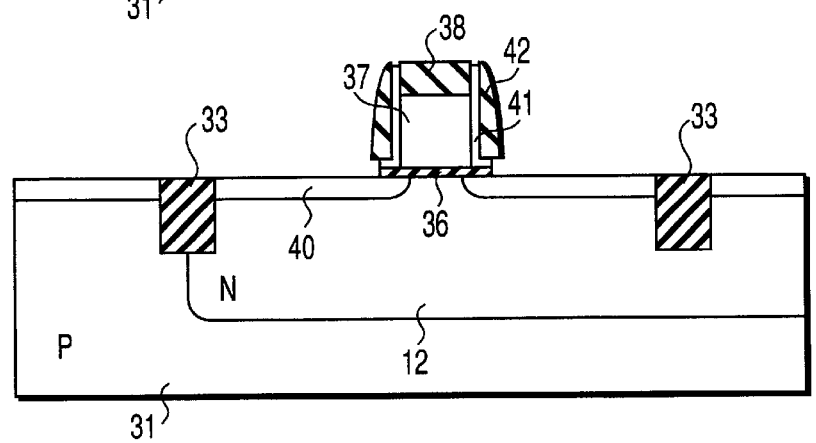

Then, the silicon selective epitaxial growth is performed. To cause the epitaxial growth to proceed, the epitaxial layer must be transferred the crystallinity of the semiconductor substrate 31. Therefore, as shown in FIG. 14F, a first step is performed such that the oxide film left on the S/D formation region is removed. Therefore, etching is performed by using diluted hydrofluoric acid before the epitaxial growth is performed. The oxide film and so forth on the exposed principal plane of the semiconductor substrate 31 is removed.

Then, pretreatment of the selective epitaxial growth step is performed such that the method according to the first and second embodiments is employed. Thus, a native oxide film (not shown) having a controlled film thickness is formed on the exposed surface of the semiconductor substrate such that a predetermined interface oxygen concentration in the range from $3 \times 10^{11}$ cm$^{-2}$ to $1.1 \times 10^{15}$ cm$^{-2}$ is formed.

Figure 14G:
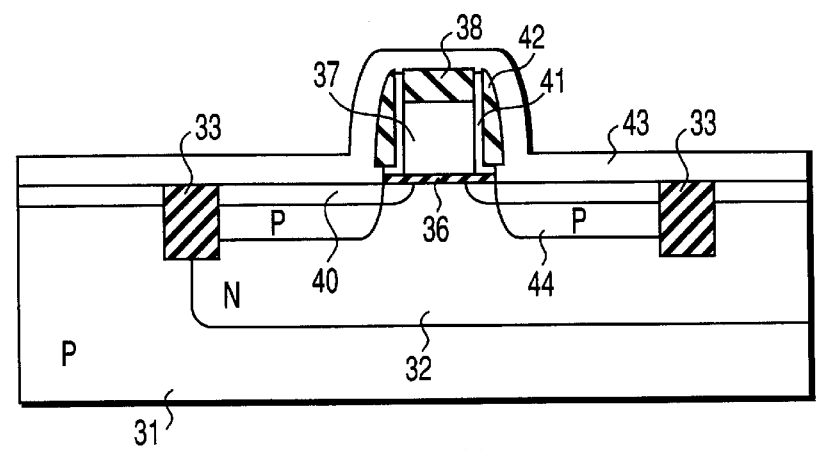

Then, as shown in FIG. 14G, the LPCVD reactor is operated such that silane or the like is used to deposit an amorphous silicon layer 43 having a film thickness of 50 nm on the overall surface of the semiconductor substrate 31 at a temperature of 600° C. such that satisfactory coverage characteristic is realized. After deposition to realize a required thickness has been completed, supply of a source gas composed of silane or the like is interrupted. Then, solid phase growth is performed by the SPE method in an $H_2$ atmosphere.

Figure 14H:
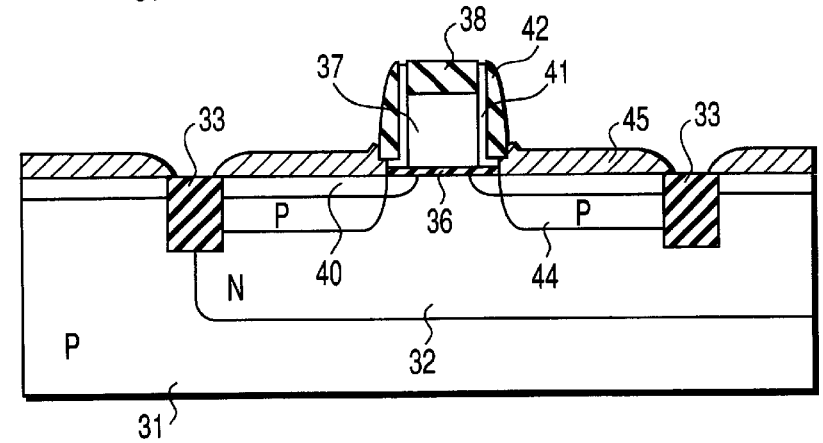

The solid phase growth is performed in only the region of the amorphous silicon layer 43 which is in contact with the semiconductor substrate 31. Therefore, the amorphous silicon layer 43 on the exposed principal plane of the semiconductor substrate 31 is changed into single crystal owing to the solid phase growth. Thus, a silicon single crystal layer 45 is formed as shown in FIG. 14H. At this time, amorphous silicon on the insulating film, such as the sidewall insulating film 42 surrounding the polysilicon layer 37 serving as the gate electrode and the device isolation region 33 is not crystallized. That is, amorphous silicon is left.

Then, a HCl gas diluted to 10% by $H_2$ is, in the same reaction chamber of the LPCVD reactor, used to remove amorphous silicon left on the insulating film similarly to the eighth embodiment.

Further, the etching gas is not limited to HCl. The other etching gas including halogen such as F, Cl, Br etc. may be utilized. N2 and Ar are used as the carrier gas. The dilution rate by the carrier gas is not limited to 10%. Pure HCl with no carrier gas can also be used as the etching gas. The etching of the silicon layer on the insulating film is not necessarily to be performed by using the thermal process. The etching methods by using plasma and radicals may also be used.

The silicon film formation and its partial etching are not necessarily to be performed in the same reaction chamber. The multi-chamber type reactor connected by the same evacuation chamber may also be utilized. Although the film formation and etching are each performed in other reaction chamber in this case, the silicon wafer can be transferred between reaction chambers without exposing to air. The merit of this invention is therefore maintained.

Even if the silicon wafer is expose to air between the process steps, the merit of lowering the process temperatures remains unchanged at a little loss of the process efficiency.

In the ninth embodiment, the upper portion of the polysilicon layer 37 serving as the gate electrode is covered with the silicon nitride film 38. Therefore, if the amorphous silicon layer 43 on the insulating film is formed into polycrystalline silicon, the etching conditions with which an etching selectivity between polysilicon and single crystal silicon can be obtained. Thus, etching at high selectivity can be performed under a condition that the temperature satisfies a somewhat higher temperature range from 700° C. to 800° C.

The deposition of the amorphous silicon layer, the solid phase growth by the SPE method and selective etching are continuously be performed in the same reaction chamber. Therefore, the productivity can considerably be improved. Then, as shown in FIG. 14H, P-type impurity ions are implanted and diffused in the P-type LDD region 40 of the semiconductor substrate 31 so that a S/D region 44 is formed.

As described above, the low-temperature heat treatment at 800° C. or lower enables a semiconductor device incorporating a MOS transistor having the elevated S/D structure to be formed. When a usual SALICIDE step is added, a semiconductor device exhibiting a high operation speed can be obtained.

As described above, the epitaxial growth by the SPE method using the solid phase growth is continuously performed in the same reaction chamber. Therefore, the productivity can considerably be improved. As compared with the conventional selective epitaxial growth method using the vapor phase growth, the process temperature can be decreased. As a result, change in the impurity profile in the fine MOSFET can be reduced. Thus, an efficient manufacturing process free from a considerable influence of the thermal history can be obtained.

Figure 15A:
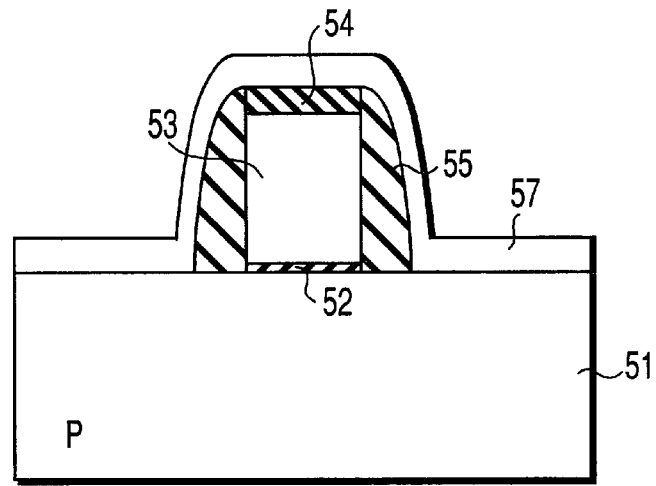
FIGS. 15A to 15C are cross sectional views showing steps of a method of manufacturing a semiconductor device according to a tenth embodiment.
Figure 15B:
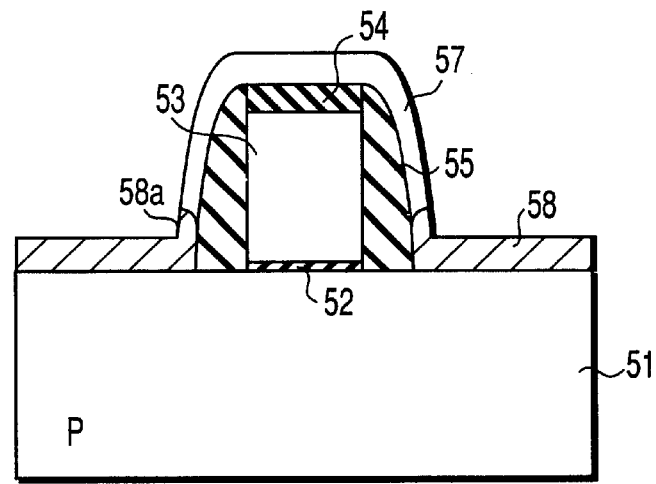
Figure 15C:
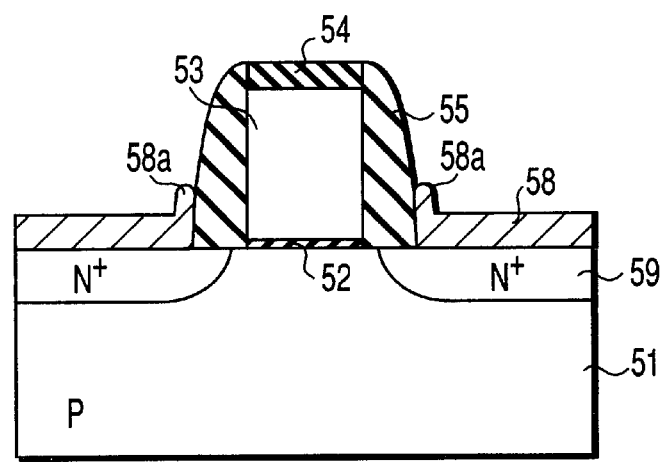

Referring to FIGS. 15A to 15C, a tenth embodiment will now be described.

The selectively grown region 10 according to the seventh embodiment encounters formation of facets 10a at the ends of the gate sidewall insulating film 8 as described with reference to FIG. 12D. Therefore, deterioration in the short channel characteristics easily occur starting with the foregoing portion because the deep junctions are formed at the facet region. Peeling of the sidewall 8 can also easily occur. In the tenth embodiment, a method with which the facets 10a are not formed will now be described.

FIGS. 15A to 15C are cross sectional views showing the structure of a semiconductor device according to a tenth embodiment and steps of a manufacturing method. A gate oxide film 52 formed by thermal oxidation or the like is formed on a semiconductor substrate 51 constituted by, for example, silicon. Then, a gate electrode 53 constituted by polysilicon is formed on the gate oxide film 52. An insulating protective film 54 constituted by silicon nitride film is formed on the upper surface of the gate electrode 53. A sidewall insulating film 55 constituted by a silicon nitride film is formed on the sidewall of the gate electrode 53.

Then, pretreatment of the selective epitaxial growth step is performed such that the method according to the first and second embodiments is employed. Thus, a native oxide film having a controlled film thickness such that a predetermined interface oxygen concentration is in the range from $3\times10^{11}$ $cm^{-2}$ to $1.1\times10^{15}$ $cm^{-2}$ is formed on the surface of the exposed semiconductor substrate 51.

Then, as shown in FIG. 15A, an amorphous silicon layer 57 is, in the LPCVD reactor, deposited on the principal plane of the semiconductor substrate 51 at 600° C. or lower to cover the gate electrode 53, the insulating protective film 54 and the sidewall insulating film 55.

Then, low-temperature heat treatment is performed in the LPCVD reactor in an $H_2$ atmosphere. Thus, solid phase growth starts in the portion which is directly deposited on the principal plane of the semiconductor substrate 51. Thus, formation of single crystal proceeds in the direction of the film thickness so that a silicon single crystal layer 58 is formed on the semiconductor substrate 51.

Then, heat treatment is continued so that formation of single crystal proceeds along the amorphous silicon layer 57 on the sidewall insulating film 55, as shown in FIG. 15B. Thus, the thickness of the silicon single crystal layer 58 is enlarged along the sidewall insulating film 55. A thick film portion 58a is able to overcome the problem of the formation of facets 10a shown in FIG. 12D and occurring in the seventh embodiment.

Then, the amorphous silicon layer 57 which has not been formed into single crystal by the low-temperature heat treatment in the $H_2$ atmosphere and which covers the insulating protective film 54 on the upper surface of the gate electrode 53 and the sidewall insulating film 55 on the sidewall of the gate electrode 53 is removed by etching with HCl gas diluted to 10% with $H_2$.

Thus, a silicon single crystal layer 58 having the thick film portion 58a is selectively formed in the S/D formation region of the MOS transistor on the semiconductor substrate 51.

Then, ion implantation is performed through the silicon single crystal layer 58 so that an N-type S/D region 59 is formed on the semiconductor substrate 51. When the silicon single crystal layer 58 incorporating the thick film portion 58a and the semiconductor substrate 51 are used, a reliable elevated S/D structure of a MOS transistor capable of overcoming the problem of the facets can be formed.

The foregoing manufacturing process are performed so that a semiconductor device incorporating a ultra-fine MOS transistor subjected to the low-temperature region heat treatment at 800° C. or lower, suitable for forming a high-speed semiconductor device, having a gate length of 0.1 μm or shorter and incorporating the elevated S/D structure can be obtained.

As described above, the silicon selective epitaxial growth using the solid phase growth by the SPE method is sequentially performed in the same reaction chamber. Therefore, the productivity can considerably be improved. As compared with the conventional selective epitaxial growth method, such as CVD, using the vapor phase growth, the process temperature can be decreased. Therefore, a process which is free from large change in the impurity profile in the fine MOSFET and on which a considerable influence of the thermal history does not exerted can be obtained.

In the tenth embodiment, the thickness of the silicon single crystal layer 58 is enlarged from the silicon single crystal layer 58 along the end of the sidewall insulating film 55. Thus, the thick film portion 58a is formed. Therefore, deterioration in the short channel effect can be overcome. Peeling off of the same caused from formation of the facets 10a described in the seventh embodiment can be also overcome.

Referring to FIGS. 16A to 16D, an eleventh embodiment will now be described.

In the eleventh embodiment, a method of forming a SALICIDE structure MOS transistor excellent in the high speed operation and incorporating the elevated S/D structure according to the present invention will now be described.

As shown in FIG. 16A, a metal film 71, such as Co, is, by a sputtering method, uniformly deposited on the overall surface of a semiconductor substrate having the selectively-formed silicon single crystal layer 68 incorporating the thick film portion 68a on the S/D region of the MOS transistor. FIG. 16A shows a structure in which the nitride film 54 on the gate electrode 53 shown in FIGS. 15A to 15C and constituted by polysilicon layer has been removed in order to improve the effect of the SALICIDE structure (lower gate resistance).

Then, as shown in FIG. 16B, heat treatment is performed at 750° C. for about 30 seconds in a nitrogen atmosphere. Thus, the silicidation takes place between the silicon single crystal layer 68 including the thick film portion 68a and the polysilicon gate 63. Thus, the metal film 71 is changed to a metal silicide layer composed of CoSi$_2$. Since the silicidation does not take place in the portion of the metal film 71 which covers the sidewall insulating film 65, the metal film 71 is maintained as it is.

Then, as shown in FIG. 16C, mixed solution of sulfuric acid and peroxide is used to perform wet etching. Thus, the metal film 71 left on the sidewall insulating film 65 can selectively be removed. As described above, use of the silicon single crystal layer 68 incorporating the thick film portion 68a enables a SALICIDE MOS transistor free from the problems of deterioration in the properties of short channel effect and peeling off caused from the formed facets 10a shown in FIG. 12D to be formed.

FIG. 16D shows the shape which is formed when the SALICIDE structure MOS transistor shown in FIG. 12D by using the silicon single crystal layer 10 having the formed facets 10a. Since the facets are present, the silicide reaction proceeds at the end of the sidewall insulating film 65 in the direction of the depth of the semiconductor substrate 61. Thus, PN junction leakage current in the S/D region is enlarged.

Figure 17A:
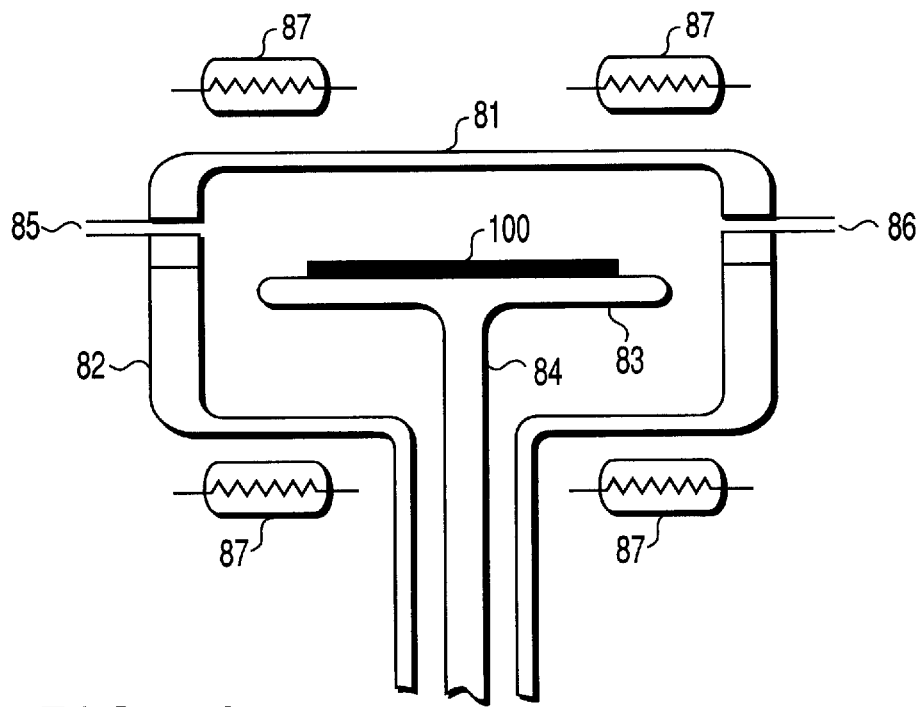
FIGS. 17A and 17B are schematic views showing a single wafer type CVD apparatus for executing the method of manufacturing the semiconductor device according to a twelfth embodiment.
Figure 17B:
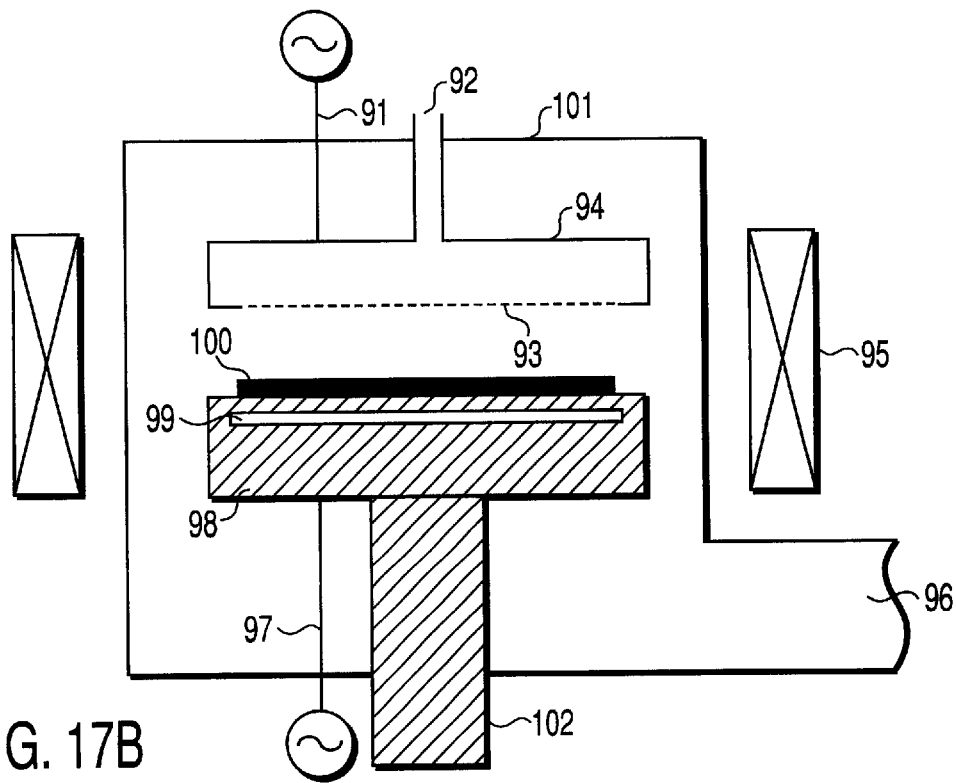

Referring to FIGS. 17A and 17B, a twelfth embodiment will now be described. FIGS. 17A and 17B are schematic views showing a one wafer type thermal LPCVD reactor or a plasma LPCVD reactor for embodying the present invention.

The overall body of the reactor portion of the thermal LPCVD reactor shown in FIG. 17A incorporates a reaction chamber, the overall body of which is made of quartz glass and which has an upper dome 81 and a lower dome 82; a susceptor 83 on which a silicon wafer 100 is placed; a support portion 84 arranged to support the susceptor 83 and incorporating a rotation mechanism; a gas inlet 85; a gas outlet 86; and an infrared-ray lamp 87.

When the thermal LPCVD reactor shown in FIG. 17A is used, substantially all film formation steps can be realized which include deposition and dry etching of amorphous silicon layer and the polysilicon layer by the vapor phase method, single-crystallization of the foregoing layers by performing heat treatment by the SPE method and formation of the oxide film and the nitride film required to form the semiconductor device incorporating the MOS transistor.

When anisotropic etching or film formation of a multiplicity of types of materials must be combined with one another, a plasma CVD apparatus shown in FIG. 17B may be used. The plasma CVD apparatus shown in FIG. 17B incorporates a reaction chamber 101 and a vacuum exhaust 96 to be capable of maintaining airtightness.

An upper lid of the reaction chamber 101 supports an upper electrode 94. A magnet 95 for causing magnetron discharge to occur is disposed on the side surface of the chamber. The upper electrode 94 incorporates a disc-shape shower nozzle incorporating a multiplicity of small openings 93 penetrating the from the upper surface to the lower surface.

The upper electrode 94 is provided with a high-frequency power source 91 for applying high-frequency voltage. The lower electrode 98 is supported by a support column 102. The support column 102 is able to move vertically. Thus, the distance between electrodes can arbitrarily be changed. The lower electrode 98 disposed above the support column 102 includes a cooling pipe for circulating a cooling agent for maintaining a constant temperature and a heater 99.

A substrate 100, such as silicon wafer, which must be processed and a chucking mechanism for securing the substrate by using electrostatic force in order to maintain heat conductivity with the portion for supporting the substrate are disposed on the lower electrode 98. The lower electrode 98 incorporates a high-frequency power source 97 for applying high-frequency voltage through the support column 102. The upper electrode 94 is disposed to spray gas from the gas supply pipe 92 to the substrate 100 which must be processed through small openings 93 of the shower nozzle. Note that all of the CVD apparatuses shown in FIGS. 17A and 17B are the one wafer type apparatuses. A batch type apparatus may be employed.

As described above, the native oxide film thinner than the mono-molecular layer is formed at the growth interface. Then, amorphous silicon or polysilicon layer is deposited in the low-temperature region. Then, the SPE method is execute in the low-temperature region for the deposited amorphous silicon or polysilicon layer to change into a single crystal. Since the method according to the present invention is structured as described, the step for forming silicon epitaxial single crystal layer can easily be employed in the process for manufacturing the semiconductor device.

Moreover, the number of steps for forming SIMOX which is advantageous to realize raising of the operation speed of a semiconductor device can considerably be reduced which has been difficult for the conventional technology to realize. Thus, the SOI structure semiconductor device can be provided at a high manufacturing yield.

When the method according to the present invention is employed, a defect free epitaxial SiGe single crystal layer can be obtained in a Ge mixed crystal ratio in a range from 20% to 50% which has been difficult for the conventional technology to realize.

When the method according to the present invention is employed, the silicon selective epitaxial growth using the SPE method can sequentially be performed in the same reaction chamber of the CVD apparatus which is usually used to form a semiconductor device. Therefore, the productivity can considerably be improved.

As compared with the selective epitaxial growth method using the conventional vapor phase growth, the process temperature can be decreased to 700° C. or lower. Therefore, a process for manufacturing a semiconductor device can be provided with which considerable change in the impurity profile in the process for manufacturing a shrinked MOS transistor can be prevented and on which a great influence of thermal history can be eliminated.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor epitaxial substrate comprising:
   a thin oxide layer formed on a semiconductor substrate; and an epitaxial semiconductor layer formed through mediation of the thin oxide layer, wherein
   a thickness of the thin oxide layer is in a range from $2\times10^{14}$ $cm^{-2}$ to $8\times10^{14}$ $cm^{-2}$ which is a value of a concentration of interface oxide between the semiconductor substrate and the epitaxial semiconductor layer.

2. A semiconductor epitaxial substrate according to claim 1, wherein the epitaxial semiconductor layer is a single crystal layer composed of SiGe mixed crystal containing a Ge composition in a range higher than 20 atom % and lower than 50 atom %.

3. A semiconductor device comprising:
   a gate insulating film formed on a semiconductor substrate;
   a gate electrode covered with an insulating film and formed on the gate insulating film;
   an exposed surface of the semiconductor substrate formed in a source region and a drain region;
   a thin oxide layer which is in contact with the exposed surface of the semiconductor substrate;
   a single crystal layer formed to be in contact with the exposed surface of the semiconductor substrate through mediation of the thin oxide layer such that a thickness of the single crystal layer at an end of the insulating film for covering the gate electrode is the same or larger than the thickness of an other portion of the single crystal layer;
   a metal silicide layer formed at least on the single crystal layer.

4. A semiconductor device according to claim 3, wherein a thickness of the thin oxide layer is in a range from $3\times10^{11}$ $cm^{-2}$ to $1.1\times10^{15}$ $cm^{-2}$ which is a value of a concentration of interface oxide between the semiconductor substrate and the epitaxial semiconductor layer.

5. A semiconductor device according to claim 3, wherein the metal silicide is cobalt silicide.

* * * * *